(12) United States Patent
Lee et al.

(10) Patent No.: US 11,626,328 B2
(45) Date of Patent: Apr. 11, 2023

(54) STRAIN ENHANCEMENT FOR FINFETS

(71) Applicant: Taiwan Semiconductor Manufacturing Co., Ltd., Hsinchu (TW)

(72) Inventors: Tsung-Lin Lee, Hsinchu (TW); Chih Chieh Yeh, Taipei (TW); Feng Yuan, Hsinchu (TW); Hung-Li Chiang, Taipei (TW); Wei-Jen Lai, Keelung (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 17/328,428

(22) Filed: May 24, 2021

(65) Prior Publication Data

US 2021/0280471 A1 Sep. 9, 2021

Related U.S. Application Data

(60) Continuation of application No. 16/410,127, filed on May 13, 2019, now Pat. No. 11,018,061, which is a
(Continued)

(51) Int. Cl.
*H01L 21/8238* (2006.01)
*H01L 27/092* (2006.01)
*H01L 29/78* (2006.01)
*H01L 21/762* (2006.01)
*H01L 21/306* (2006.01)
*H01L 21/02* (2006.01)

(52) U.S. Cl.
CPC .......... *H01L 21/823821* (2013.01); *H01L 21/30604* (2013.01); *H01L 21/76224* (2013.01); *H01L 21/823878* (2013.01); *H01L 27/0924* (2013.01); *H01L 29/7843* (2013.01); *H01L 29/7846* (2013.01); *H01L 21/0217* (2013.01); *H01L 21/0228* (2013.01); *H01L 21/02164* (2013.01); *H01L 21/02178* (2013.01); *H01L 21/02271* (2013.01); *H01L 21/02337* (2013.01); *H01L 21/02348* (2013.01)

(58) Field of Classification Search
CPC ....... H01L 21/823821; H01L 21/30604; H01L 21/76224; H01L 21/823878; H01L 27/0924; H01L 29/7843; H01L 29/7846; H01L 21/02164; H01L 21/0217; H01L 21/02178; H01L 21/02271; H01L 21/0228; H01L 21/02337; H01L 21/02348
See application file for complete search history.

(56) References Cited

U.S. PATENT DOCUMENTS 6,882,025 B2 4/2005 Yeo et al.
7,808,051 B2 10/2010 Hou et al.
(Continued)

*Primary Examiner* — David Vu
(74) *Attorney, Agent, or Firm* — Slater Matsil, LLP

(57) ABSTRACT

An integrated circuit device includes a substrate having a first portion in a first device region and a second portion in a second device region. A first semiconductor strip is in the first device region. A dielectric liner has an edge contacting a sidewall of the first semiconductor strip, wherein the dielectric liner is configured to apply a compressive stress or a tensile stress to the first semiconductor strip. A Shallow Trench Isolation (STI) region is over the dielectric liner, wherein a sidewall and a bottom surface of the STI region is in contact with a sidewall and a top surface of the dielectric liner.

20 Claims, 18 Drawing Sheets

Related U.S. Application Data continuation of application No. 15/220,989, filed on Jul. 27, 2016, now Pat. No. 10,290,550, which is a division of application No. 14/153,632, filed on Jan. 13, 2014, now Pat. No. 9,419,134.

(56) References Cited

U.S. PATENT DOCUMENTS

| | | |
|---|---|---|
| 8,102,004 B2 | 1/2012 | Nagatomo |
| 8,698,199 B2 | 4/2014 | Chen et al. |
| 8,823,132 B2 | 9/2014 | Liou et al. |
| 8,835,262 B2 | 9/2014 | Cai et al. |
| 8,889,500 B1 | 11/2014 | Kamineni et al. |
| 9,530,775 B2 | 12/2016 | Cai et al. |
| 2002/0031890 A1 | 3/2002 | Watanabe et al. |
| 2005/0019999 A1 | 1/2005 | Lee et al. |
| 2007/0120156 A1 | 5/2007 | Liu et al. |
| 2009/0140375 A1 | 6/2009 | Kim |
| 2009/0203188 A1 | 8/2009 | Shin et al. |

STRAIN ENHANCEMENT FOR FINFETS

PRIORITY CLAIM AND CROSS-REFERENCE

This application is a continuation of U.S. patent application Ser. No. 16/410,127, filed on May 13, 2019, which is a continuation of U.S. patent application Ser. No. 15/220,989, entitled "Strain Enhancement for FinFETs," filed on Jul. 27, 2016, now U.S. Pat. No. 10,290,550, issued on May 14, 2019, which is a divisional of U.S. patent application Ser. No. 14/153,632, entitled "Strain Enhancement for Fin-FETs," filed on Jan. 13, 2014, now U.S. Pat. No. 9,419,134 issued Aug. 16, 2016, which applications are incorporated herein by reference.

BACKGROUND

Reductions in the size and inherent features of semiconductor devices (e.g., a metal-oxide semiconductor field-effect transistor) have enabled continued improvement in speed, performance, density, and cost per unit function of integrated circuits over the past few decades. In accordance with a design of the transistor and one of the inherent characteristics thereof, modulating the length of a channel region underlying a gate between a source and drain of the transistor alters a resistance associated with the channel region, thereby affecting the performance of the transistor. More specifically, shortening the length of the channel region reduces a source-to-drain resistance of the transistor, which, assuming other parameters are maintained relatively constant, may allow an increase in current flow between the source and drain when a sufficient voltage is applied to the gate of the transistor.

To further enhance the performance of MOS devices, stress may be introduced in the channel region of a MOS transistor to improve carrier mobility. Generally, it is desirable to induce a tensile stress in the channel region of an n-type metal-oxide-semiconductor ("NMOS") device in a source-to-drain direction and to induce a compressive stress in the channel region of a p-type MOS ("PMOS") device in a source-to-drain direction.

A commonly used method for applying compressive stress to the channel regions of PMOS devices is to grow SiGe stressors in the source and drain regions. Such a method typically includes the steps of forming a gate stack on a semiconductor substrate, forming spacers on sidewalls of the gate stack, forming recesses in the silicon substrate along the gate spacers, epitaxially growing SiGe stressors in the recesses, and then annealing. Since SiGe has a greater lattice constant than silicon has, it expands after annealing and applies a compressive stress to the channel region, which is located between a source SiGe stressor and a drain SiGe stressor. Similarly, stresses can be introduced to the channel regions of NMOS devices by forming SiC stressors. Since SiC has a smaller lattice constant than silicon has, it contracts after annealing and applies a tensile stress to the channel region.

The MOS devices formed from conventional stressor formation processes suffer leakage problems, however. To apply a greater stress to the channel region, the stressors need to have high germanium or carbon concentrations. High germanium or carbon concentrations in turn cause high defect concentrations, and thus cause an increase in junction leakage and a decrease in breakdown voltage. Accordingly, new methods for improving the stressor formation processes are needed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Complementary Fin Field-Effect Transistors (FinFETs) and the method of forming the same are provided in accordance with various exemplary embodiments. The intermediate stages of forming the FinFETs are illustrated. The variations of the embodiments are discussed. Throughout the various views and illustrative embodiments, like reference numbers are used to designate like elements.

Figure 1:
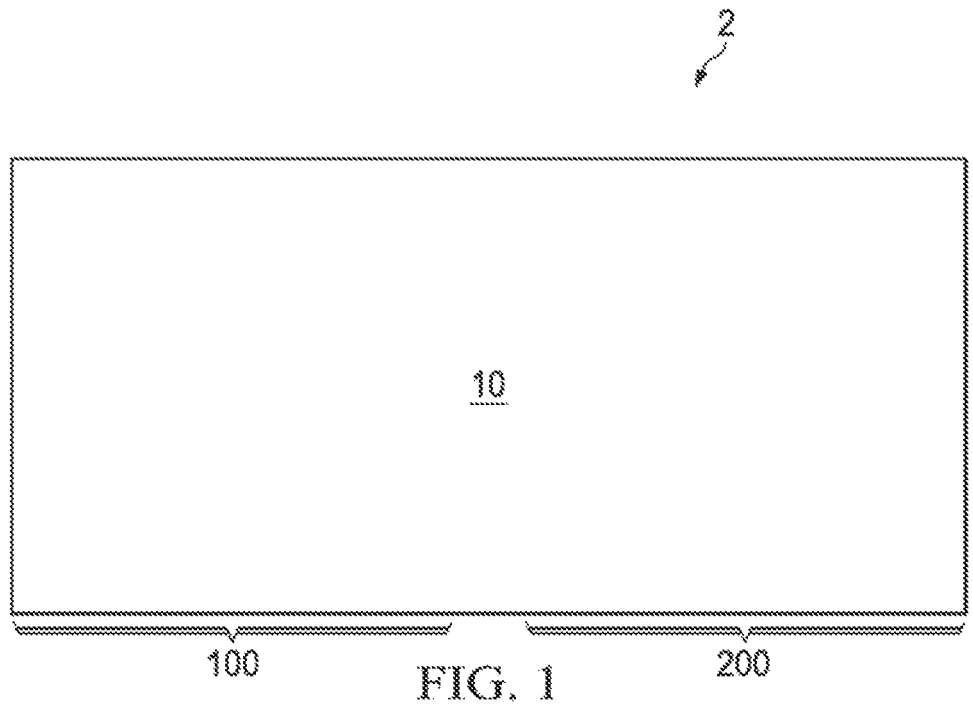
FIGS. 1 through 8 are cross-sectional views of intermediate stages in the formation of Fin Field-Effect Transistors (FinFETs) with stressed fins in accordance with some exemplary embodiments.

FIGS. 1 through 8 illustrate the cross-sectional views of intermediate stages in the manufacturing of Fin Field-Effect Transistors (FinFETs) in accordance with some embodiments. Referring to FIG. 1, wafer 2 is provided. Wafer 2 includes substrate 10, which may be a semiconductor substrate in some embodiments. Substrate 10 may be a silicon substrate, a germanium substrate, a silicon germanium substrate, a III-V compound semiconductor substrate, or the like. Wafer 2 includes a portion in device region 100, and a portion in device regions 200. Device regions 100 and 200 are used to form a p-type FinFET and an n-type FinFET. In some embodiments, device region 100 is for forming the p-type FinFET, and device region 200 is for forming the n-type FinFET. In alternative embodiments, device region 100 is for forming the n-type FinFET, and device region 200 is for forming the p-type FinFET.

Figure 2:
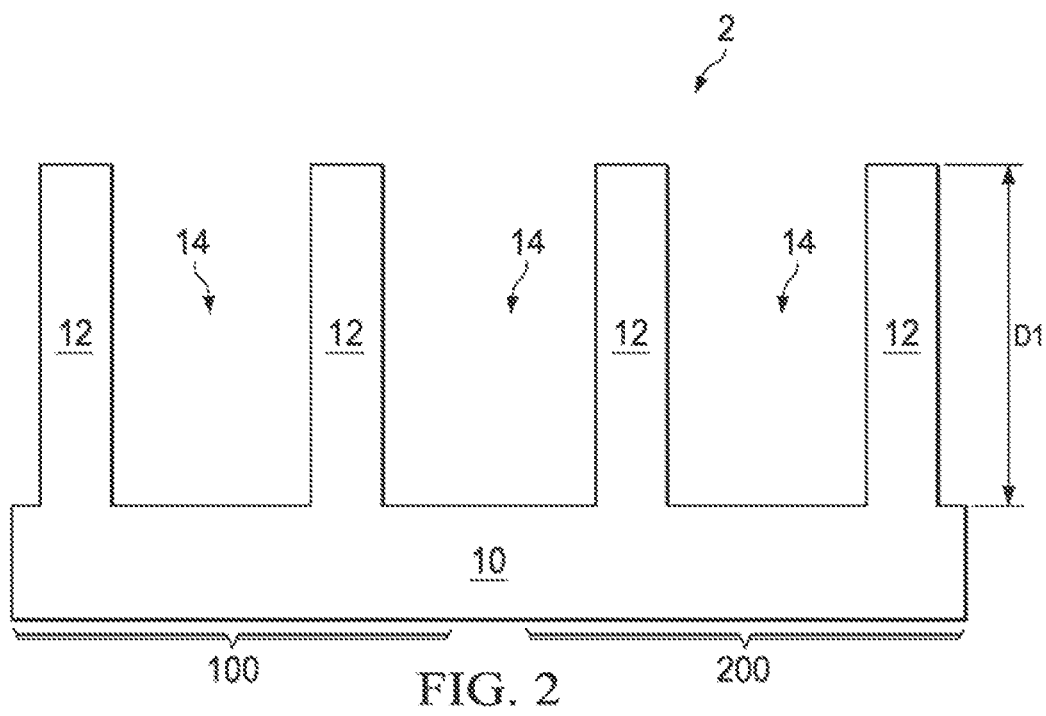

Referring to FIG. 2, substrate 10 is etched to form trenches 14, with semiconductor strips 12, which are parts of substrate 10, left between trenches 14. Depth D1 of trenches 14 may be in the range between about 100 nm and about 170 nm. It is appreciated, however, that the values recited throughout the description are merely examples, and may be changed to different values. The etching may be performed using a SiCoNi-based gas. After the formation of trenches 14, a pre-treatment may be performed. The pre-treatment is performed at a temperature in the range between about 400° C. and about 1,200° C. in some embodiments. The treatment gas may include oxygen ($O_2$), water steam ($H_2O$), nitrogen ($N_2$), or the like. As a result of the pre-treatment, a thin film (not shown) may be formed on the exposed surfaces of semiconductor strips 12. The thin film may include an oxide, a nitride, or the like, wherein the material of the thin film depends upon the material of substrate 10 and the process gas used in the pre-treatment. In some embodiments, the pre-treatment is a thermal treatment performed at a temperature in the range between about 400° C. and about 1,200° C. In alternative embodiments, the treatment includes a Ultra-Violet (UV) treatment using a UV light with a wavelength in the range between about 200 nm and about 400 nm. In yet alternative embodiments, the pre-treatment includes a microwave treatment using a microwave with a wavelength greater than about 1 mm. During the pre-treatment, wafer 2 may be heated (for example, to the above-referenced temperatures) or at a room temperature (such as about 21° C.).

Figure 3:
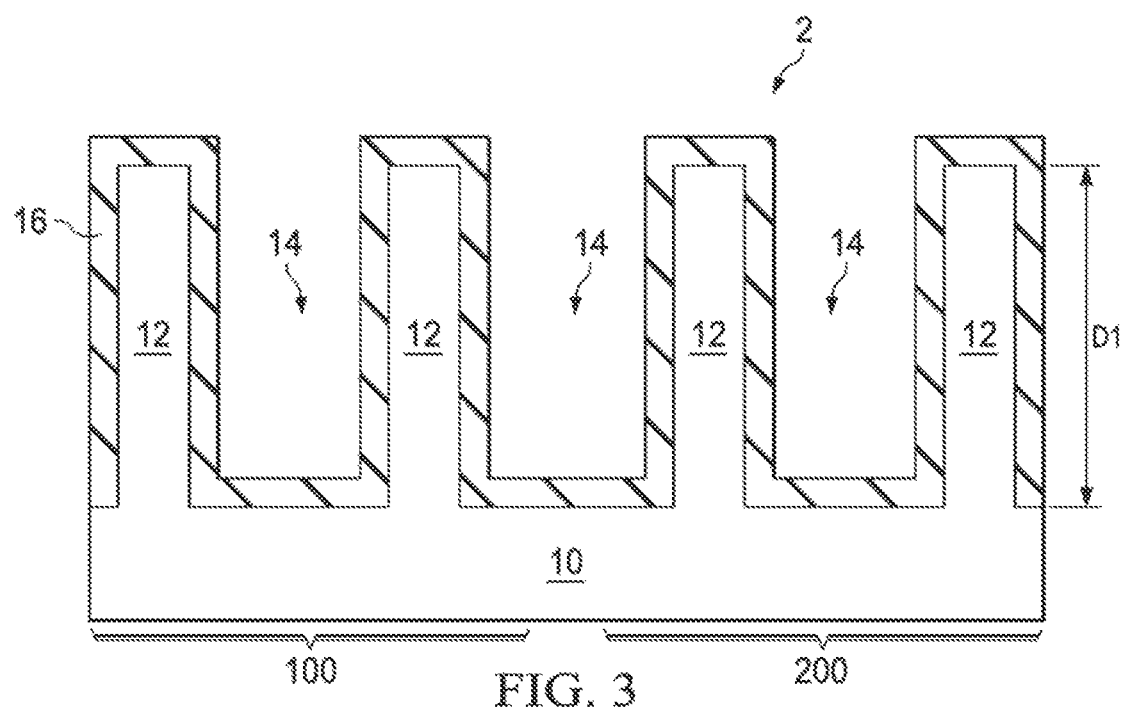

FIG. 3 illustrates the formation of dielectric liner 16, which is formed using a deposition method and/or an oxidation or a nitridation method. Dielectric liner 16 may be a single homogenous layer or a composite layer, and may include a silicon nitride ($Si_3N_4$) layer, a silicon oxide ($SiO_2$) layer, an aluminum oxide ($Al_2O_3$) layer, or multi-layers thereof. Dielectric liner 16 may also have a high Young's modulus, for example, higher than about 100 G Pa. The respective material with the high Young's modulus may include SiON, SiN, or $Si_3N_4$, for example. The thickness of dielectric liner 16 (and each of the silicon nitride layer, the silicon oxide layer, and the aluminum oxide layer) may be in the range between about 1 nm and about 5 nm. In some exemplary embodiments, the formation of the silicon nitride layer is performed using Chemical Vapor Deposition (CVD), Atomic Layer Deposition (ALD), Molecular Layer Deposition (MLD), or the like. The deposition temperature may be in the range between about 300° C. and about 700° C., with plasma turned on to assist the deposition. The precursor may include $SiH_4$, Dichloro-Silane (DCS), $NH_3$, and/or the like. In some exemplary embodiments, the formation of the silicon oxide layer is performed using CVD, ALD, or the like. The deposition temperature may be in the range between about 300° C. and about 700° C., with plasma turned on to assist the deposition. The precursor may include $SiH_4$, DCS, $N_2O$, $H_2O$, $O_2$, and/or the like. In some exemplary embodiments, the formation of the aluminum oxide layer is performed using ALD. The deposition temperature may be in the range between about 500° C. and about 600° C. The precursor may include $AlH_3$, $H_2O$, and the like.

After the formation of dielectric liner 16, a treatment is performed. In some embodiments, the treatment is performed using a thermal treatment, a UV treatment, or a microwave treatment, wherein the process conditions may be selected from the candidate process conditions for the pre-treatment, which is performed before dielectric liner 16 is formed. For example, the treatment gas may include oxygen ($O_2$), water steam ($H_2O$), nitrogen ($N_2$), or the like. When the thermal treatment is performed, the temperature may be in the range between about 400° C. and about 1,200° C. When the UV treatment is used, the UV light may have a wavelength in the range between about 200 nm and about 400 nm. When the microwave treatment is used, the wavelength may be greater than about 1 mm.

By adjusting formation process conditions, the material, and the treatment conditions of dielectric liner 16, dielectric liner 16 may apply a compressive stress, a tensile stress, or a neutral stress. Throughout the description, when a compressive stress or a tensile stress applied on semiconductor strips 12 is referred to, the compressive stress or the tensile stress has a magnitude higher than about 300 MPa. Furthermore, when a neutral stress is referred to, the neutral stress refers to no stress or stresses with stress magnitude smaller than about 300 MPa. In some exemplary embodiments, to make dielectric liner 16 to apply a compressive stress to semiconductor strips 12, dielectric liner 16 comprises tensile silicon nitride, and the respective formation process and/or treatment process comprise Chemical Vapor Deposition (CVD) at 400° C., followed by a Ultra-Violet (UV) curing. In some alternative embodiments, to make dielectric liner 16 to apply a tensile stress to semiconductor strips 12, dielectric liner 16 comprises compressive silicon nitride, and the respective formation process and/or treatment process comprises CVD at 400° C., with no UV curing performed. In yet alternative embodiments, to make dielectric liner 16 to apply a neutral stress to semiconductor strips 12, dielectric liner 16 comprises silicon nitride, and the respective formation process and/or treatment process comprise CVD at 400° C., wherein the process gas has higher $NH_3$ flow rate than the flow rates for forming tensile and compressive silicon nitrides. In yet alternative embodiments, to make dielectric liner 16 to have the high Young's modulus, dielectric liner 16 comprises $Al_2O_3$, silicon nitride, or the like, and the respective formation process and/or treatment process comprise Atomic Layer Deposition (ALD), Molecular Layer Deposition (MLD), CVD, or the like.

Figure 4:
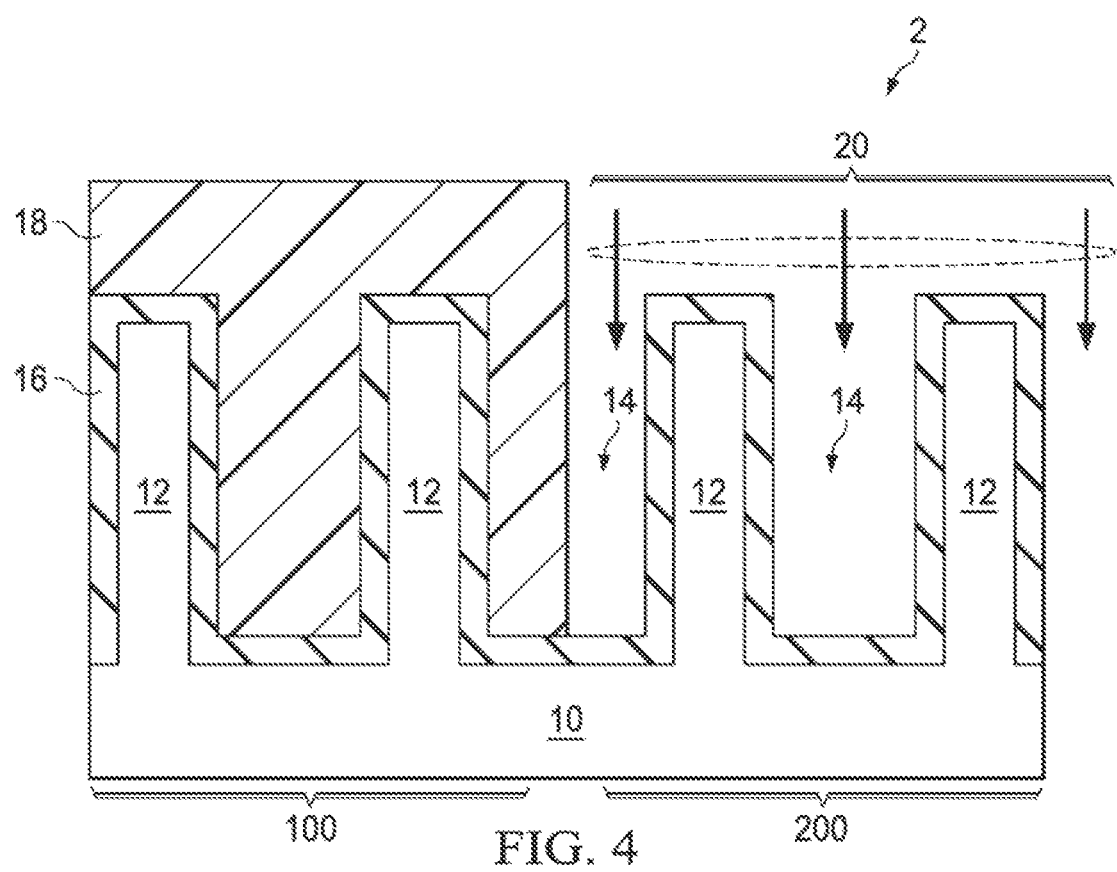
Figure 5:
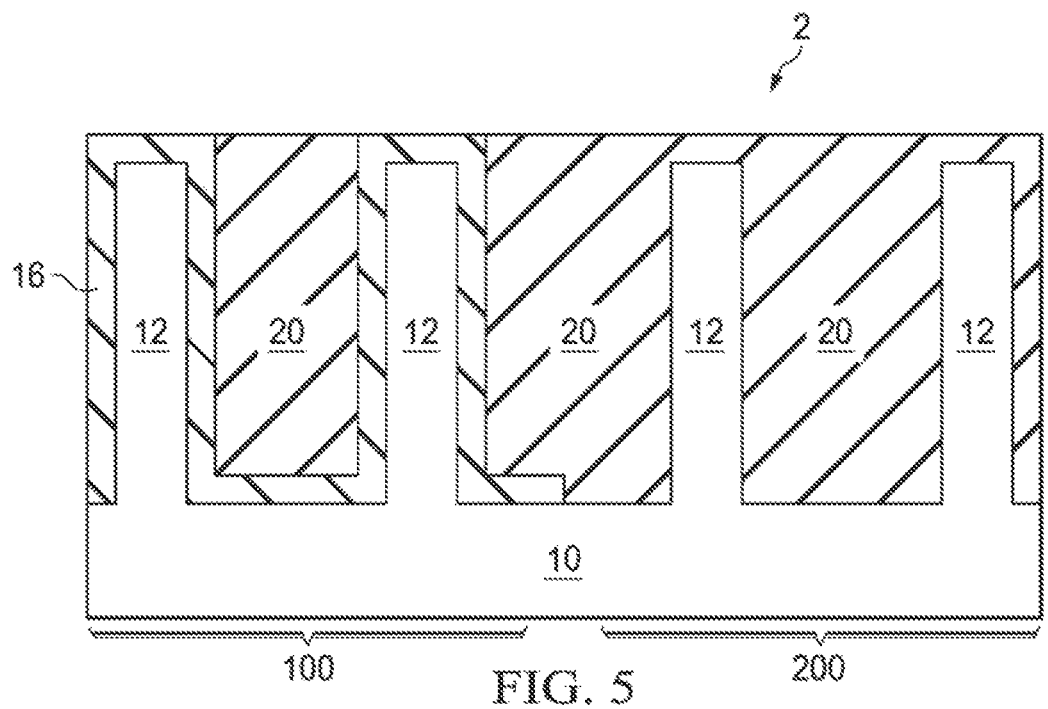
Figure 6:
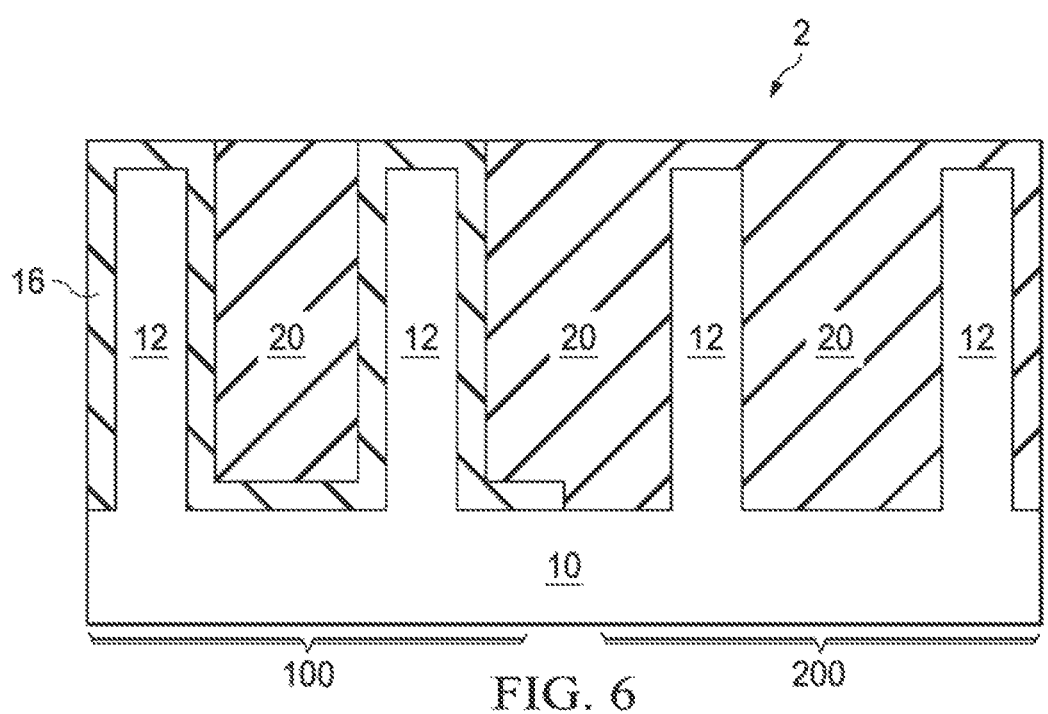

Next, referring to FIGS. 4 and 5, dielectric liner 16 is removed from device region 200, and is left in device region 100. Referring to FIG. 4, photo resist 18 is formed and patterned to cover the portion of dielectric liner 16 in device region 100, while the portion of dielectric liner 16 in device region 200 is removed. Next, the exposed dielectric liner 16 is removed, for example, using a SiCoNi gas. The etching is symbolized by arrows 21. Photo resist 18 is then removed, as shown in FIG. 5.

FIG. 5 also illustrates the filling of dielectric material 20. Dielectric material 20 may be formed of a homogenous material, or may include more than one layer formed of different materials or formed using different methods. A planarization such as a Chemical Mechanical Polish (CMP) is performed to level the top surface of dielectric material 20 with the top surfaces of dielectric liner 16 or the top surfaces of semiconductor strips 12. The remaining dielectric material 20 forms Shallow Trench Isolation (STI) regions 20. In some embodiments, dielectric material 20 includes an oxide, which is silicon oxide in some embodiments. Dielectric material 20 may be formed using Flowable Chemical Vapor Deposition (FCVD), spin-on, or the like.

After the filling of dielectric material 20, and before or after the CMP, a treatment is performed on dielectric material (STI regions) 20. The treatment may be performed using a thermal treatment, a UV treatment, a microwave treatment, or the like, wherein the process conditions may be selected from the candidate methods and candidate process conditions for the treatment (as shown in FIG. 3) of dielectric liner 16. In addition, when the treatment is used, the treatment may be performed at a temperature lower than the treatment temperature of dielectric liner 16. In some exemplary embodiments, the treatment temperature of STI regions 20 is lower than the treatment temperature of dielectric liner 16 by a temperature difference greater than about 100° C.

STI regions 20 may by themselves apply a compressive stress, a tensile stress, or a neutral stress (no stress) to the adjoining semiconductor strips 12 in device region 200. On the other hand, in device region 100, STI regions 20 and dielectric liner 16 in combination apply a stress (referred to as combined stress throughout the description, which may be a compressive stress, a tensile stress, or a neutral stress) to the adjoining semiconductor strips 12. Accordingly, the different schemes of dielectric liner 16 and STI regions 20 may generate desirable stress combinations for p-type FinFET and n-type FinFET.

For example, if device region 100 is an n-type FinFET region and device region 200 is a p-type region, then it is desirable that the stress applied to the semiconductor strips 12 in device region 100 is more toward tensile direction than the stress applied to the semiconductor strips 12 in device region 200. In some embodiments, dielectric liner 16 may apply a tensile stress, and STI regions 20 may apply a tensile stress, a compressive stress, or a neutral stress to the adjoining semiconductor strips 12. The combined stress applied to semiconductor strips 12 in device region 200 may be a tensile stress, a neutral stress, or a compressive stress. Alternatively, dielectric liner 16 has the high Young's modulus, for example, higher than about 100 GPa, and STI regions 20 apply a compressive stress. Accordingly, dielectric liner 16, due to the high Young's modulus, blocks (at least partially) or reduces the compressive stress from being applied to the semiconductor strips 12 in device region 100, while the semiconductor strips 12 in device region 200 receive the compressive stress.

Alternatively, if device region 100 is a p-type FinFET region and device region 200 is an n-type region, then it is desirable that the stress applied to the semiconductor strips 12 in device region 100 is more toward compressive direction than the stress applied to the semiconductor strips 12 in device region 200. In some embodiments, dielectric liner 16 applies a compressive stress, and STI regions 20 apply a tensile stress, a compressive stress, or a neutral stress to the adjoining semiconductor strips 12. The combined stress applied to semiconductor strips 12 in device region 200 may be a tensile stress, a neutral stress, or a compressive stress. Alternatively, dielectric liner 16 has the high Young's modulus, for example, higher than about 100 GPa, and STI regions 20 apply a tensile stress. Accordingly, dielectric liner 16, due to the high Young's modulus, blocks (at least partially) or reduces the tensile stress from being applied to the semiconductor strips 12 in device region 100, while the semiconductor strips 12 in device region 200 receives the tensile stress.

Figure 7:
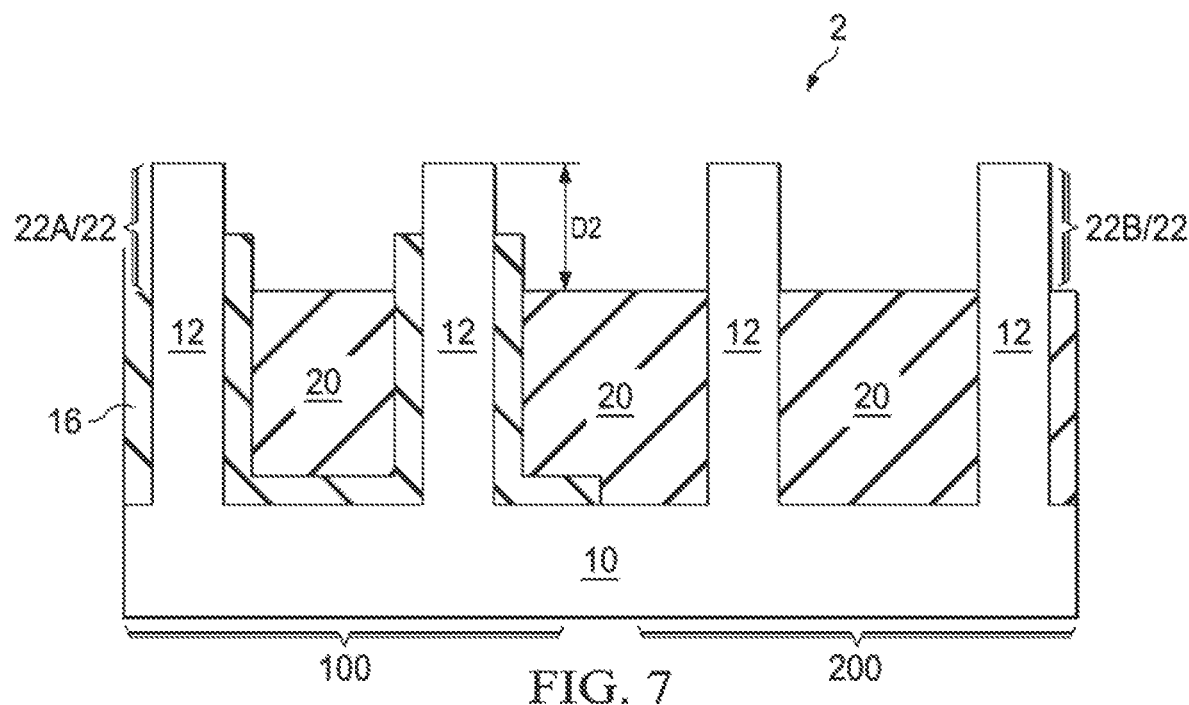

Next, as shown in FIG. 7, STI regions 20 and dielectric liner 16 are recessed, for example, through a wet etching or a dry etching step. The recessing depth D2 may be between about 20 nm and about 40 nm in some embodiments. Accordingly, the portions of semiconductor strips 12 over the top surfaces of remaining STI regions 20 are referred to as semiconductor fins 22, which include fins 22A in device region 100 and fins 22B in device region 200.

Figure 8:
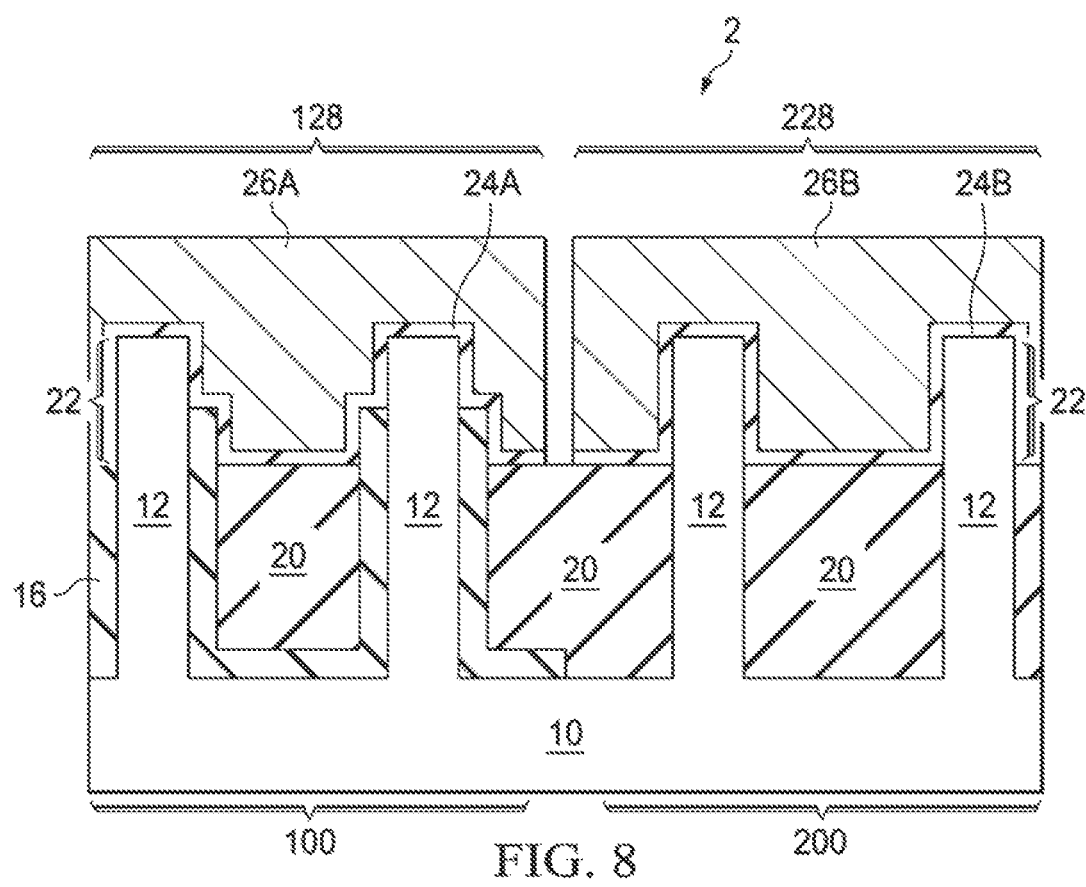

FIG. 8 illustrates the formation of gate dielectrics 24 (including 24A and 24B in device regions 100 and 200, respectively). Gate electrodes 26 (including 26A and 26B) are formed over gate dielectrics 24A and 24B, respectively. Gate dielectrics 24 may include oxide, nitride, high-k dielectrics, or the like. Gate electrodes 26 may include polysilicon, metal or metal alloys, metal silicides, or the like. In subsequent process steps, source and drain regions (not shown) are formed in each of device regions 100 and 200 to finish the formation of FinFETs 128 and 228 in device regions 100 and 200, respectively. One of FinFETs 128 and 228 is a p-type FinFET, and the other is an n-type FinFET. The desirable stresses in semiconductor fins 22 are related to the conductivity types of FinFETs 128 and 228, wherein the fins 22 of the n-type FinFET is more tensile than the fins 22 of the p-type FinFET. The desirable stresses are achieved using the methods provided in preceding paragraphs.

FIGS. 9 through 36 illustrate cross-sectional views of intermediate stages in the formation of complementary FinFETs in accordance with alternative embodiments. Unless specified otherwise, the materials and the formation methods of the components in these embodiments are essentially the same as the like components, which are denoted by like reference numerals in the embodiments shown in FIGS. 1 through 8. The details regarding the formation process and the materials of the components shown in FIGS. 9 through 36 may thus be found in the discussion of the embodiment shown in FIGS. 1 through 8.

Figure 9:
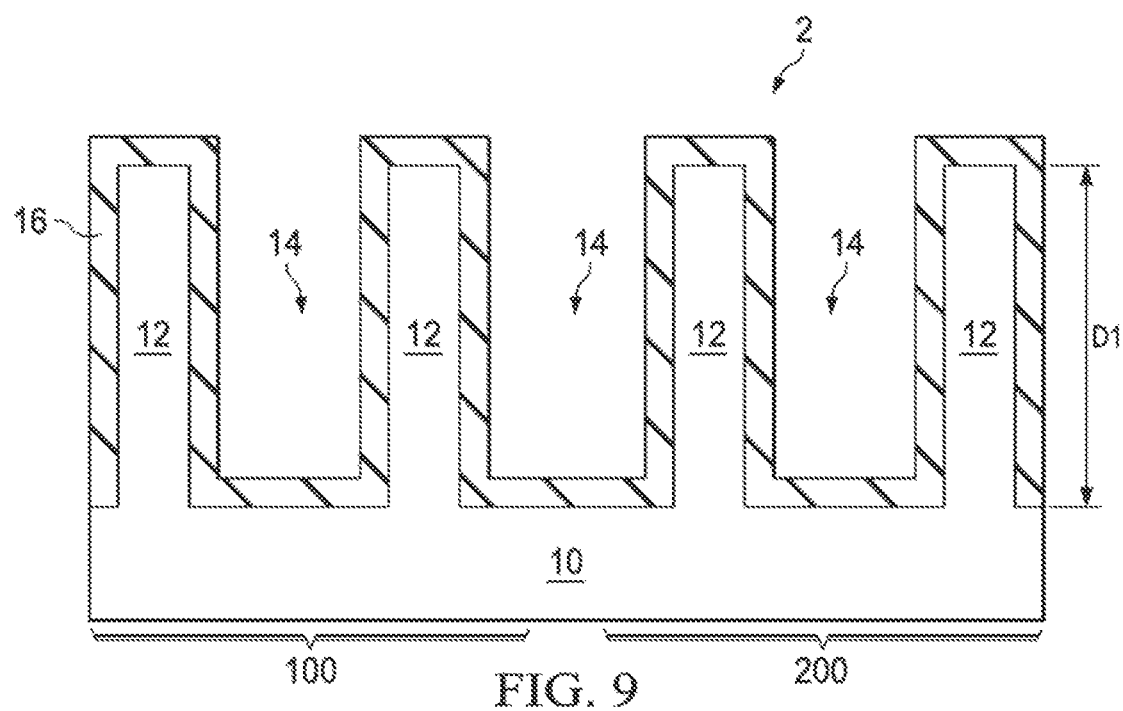
FIGS. 9 through 17 are cross-sectional views of intermediate stages in the formation of FinFETs with stressed fins in accordance with alternative embodiments.

FIGS. 9 through 17 illustrate the formation of complementary FinFETs in accordance with some embodiments. The initial steps of these embodiments are essentially the same as shown in FIGS. 1 and 2. Next, as shown in FIG. 9, dielectric liner 16 is formed. In subsequent discussion of the embodiments in FIGS. 9 through 17, it is assumed that device region 100 is an n-type FinFET region, and device region 200 is a p-type FinFET region. Dielectric liner 16 may apply a tensile stress or a neutral stress to adjoining semiconductor strips 12. Alternatively, dielectric liner 16 has a high Young's modulus. The materials and the formation details for forming the tensile-stress applying dielectric liner 16, the neutral-stress applying dielectric liner 16, or dielectric liner 16 with high Young's modulus may be found in the description of the embodiments in FIGS. 1 through 8.

Figure 10:
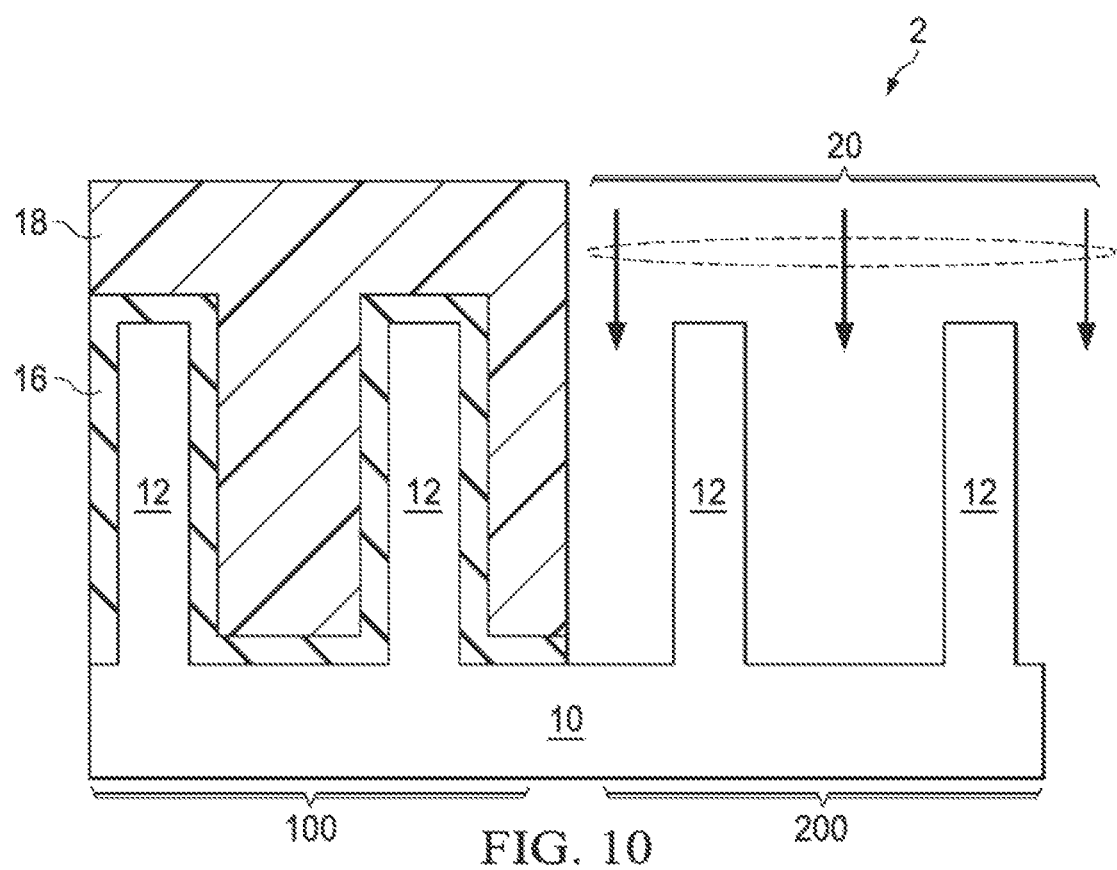
Figure 11:
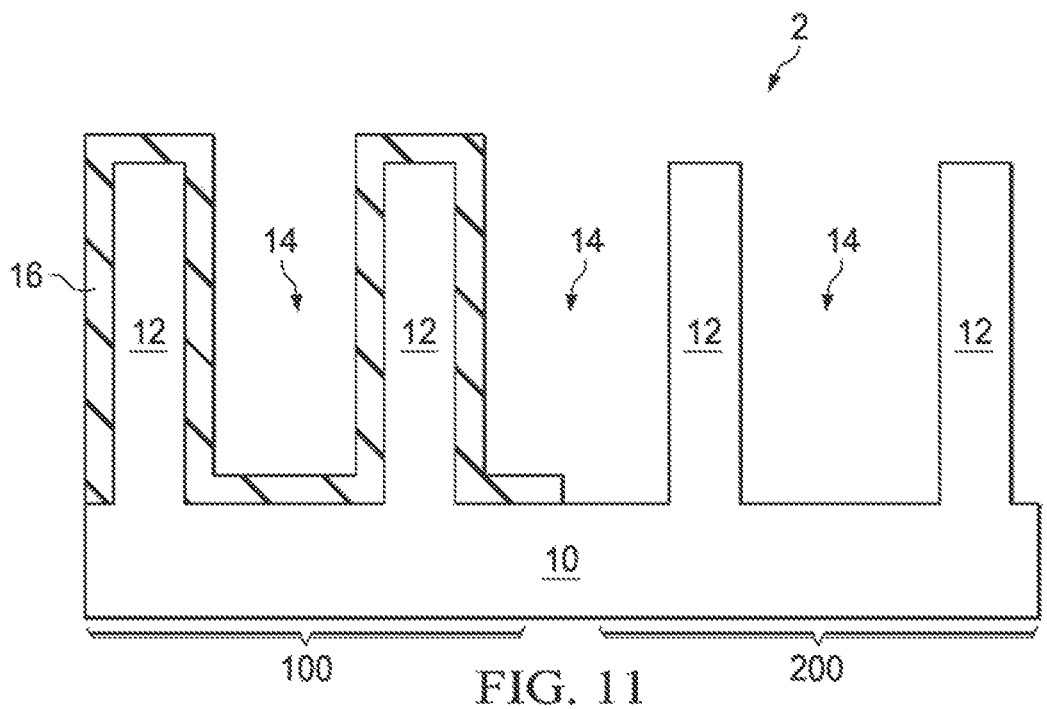

FIGS. 10 and 11 illustrate the removal of dielectric liner 16 from device region 200. In FIG. 10, photo resist 18 is formed in device region. Next, photo resist 18 is used as an etching mask to etch dielectric liner 16 from device region 200. As shown in FIG. 11, photo resist 18 is removed.

Figure 12:
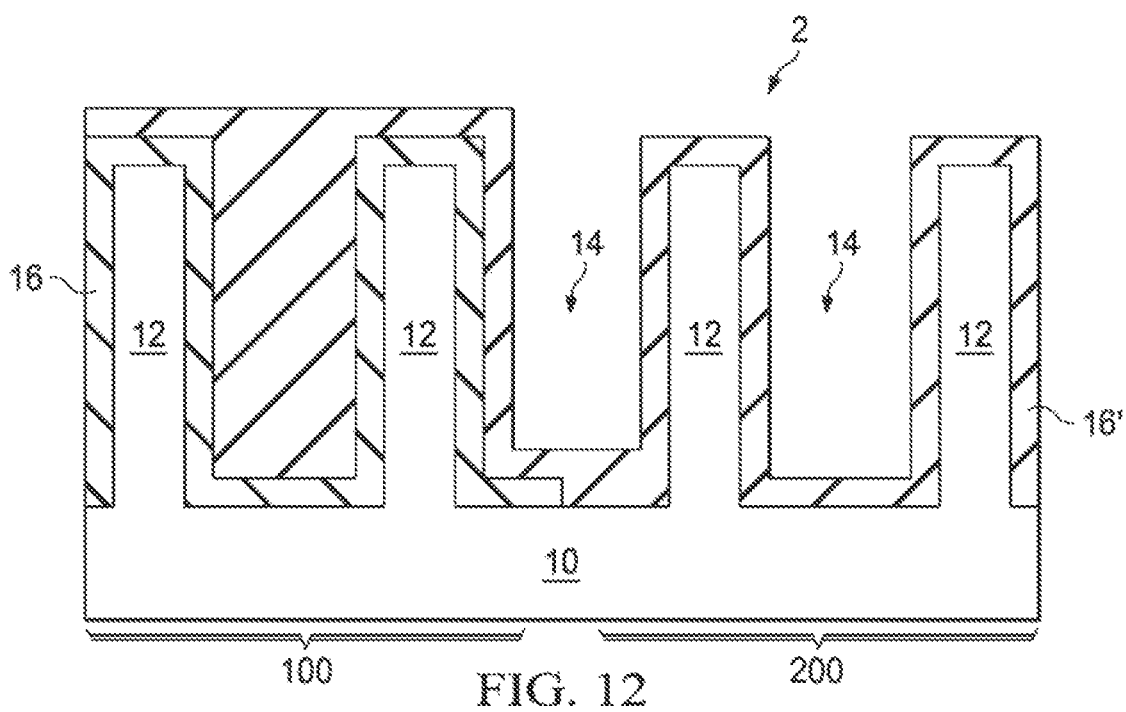
Figure 13:
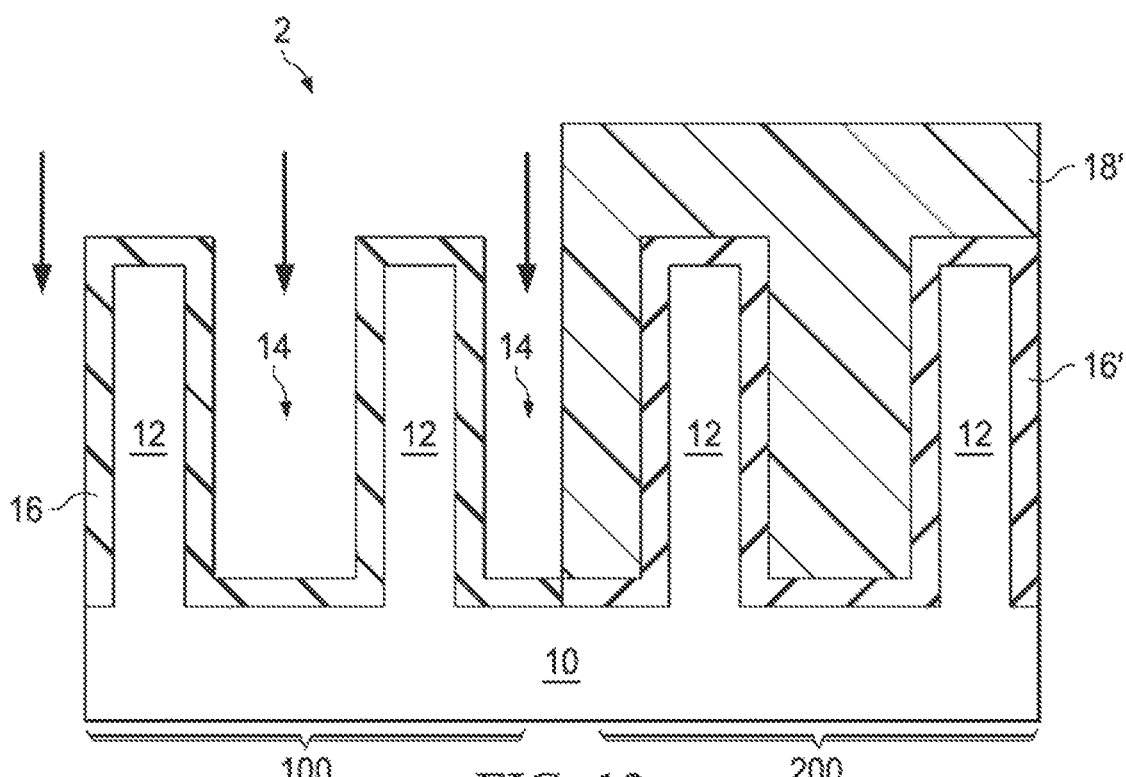
Figure 14:
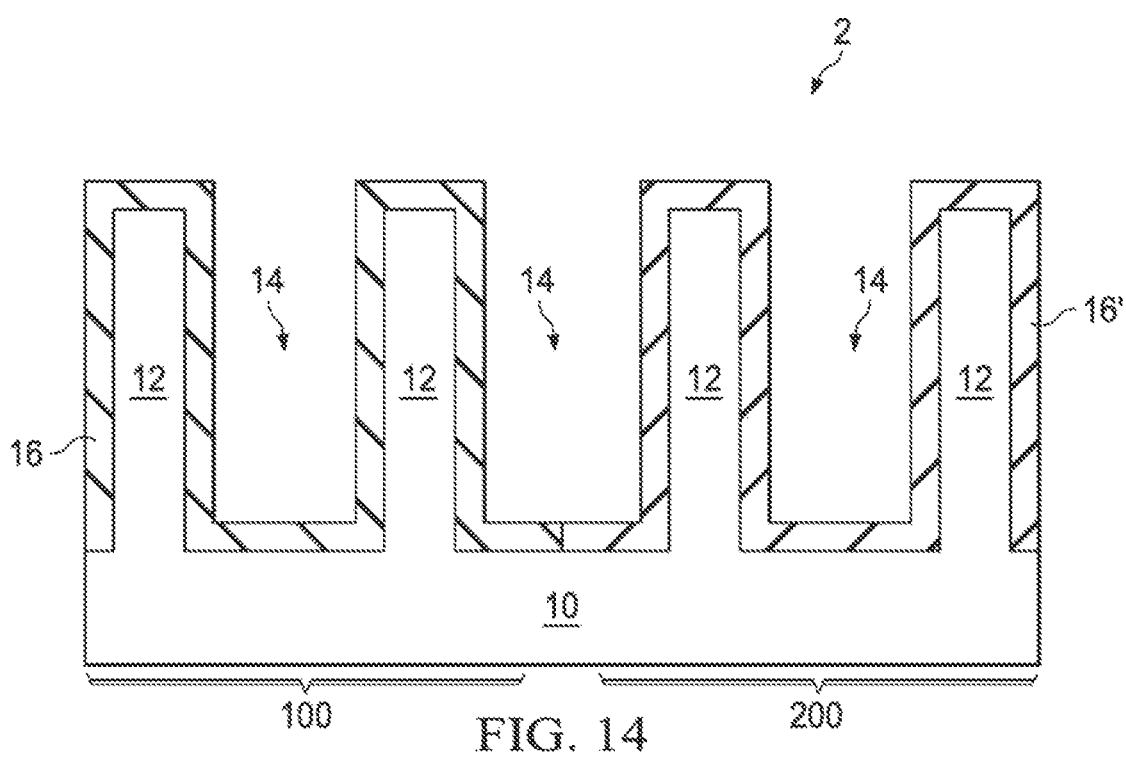

Next, as shown in FIGS. 12 through 14, dielectric liner 16' is formed in device region 200, and is removed from device region 100. As shown in FIG. 12, dielectric liner 16' is blanket formed in device regions 100 and 200. Dielectric liner 16' may apply a compressive stress or a neutral stress to semiconductor strips 12. Alternatively, dielectric liner 16' has a high Young's modulus. The materials and the formation details for forming the compressive-stress applying dielectric liner 16', the neutral-stress applying dielectric liner 16', or the dielectric liner 16' with high Young's modulus are selected from the candidate materials and formation process details for forming dielectric liner 16, which may be found in the description of the embodiments in FIGS. 1 through 8.

Figure 15:
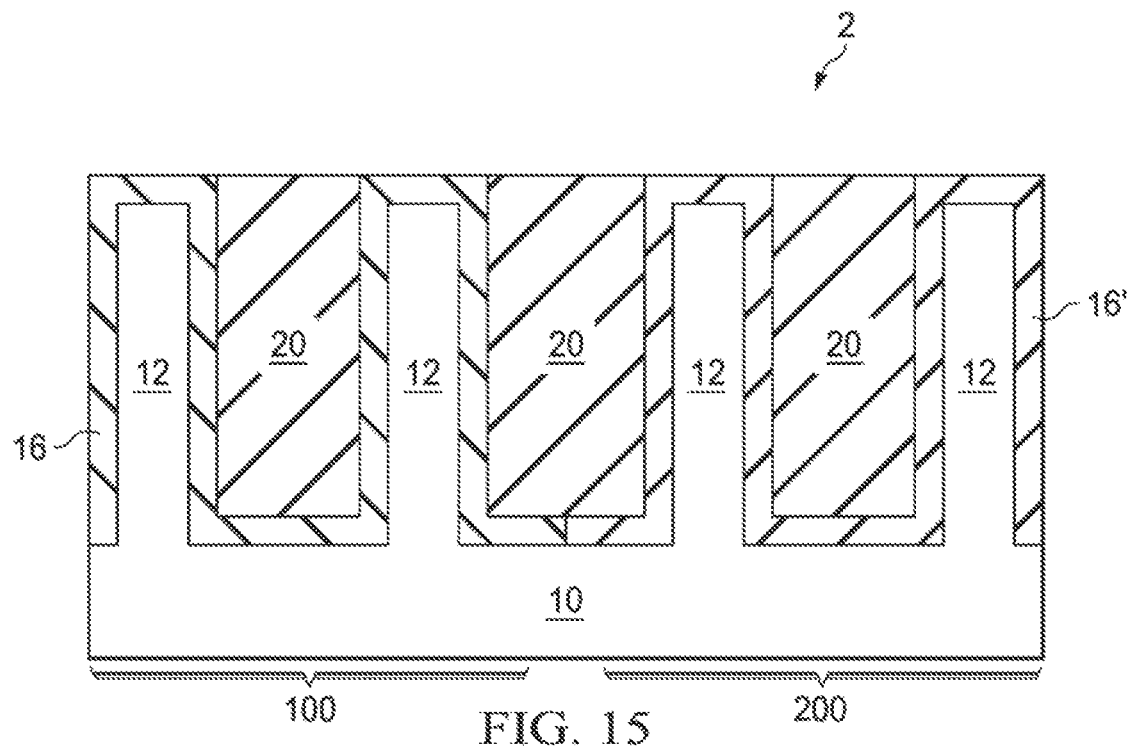
Figure 16:
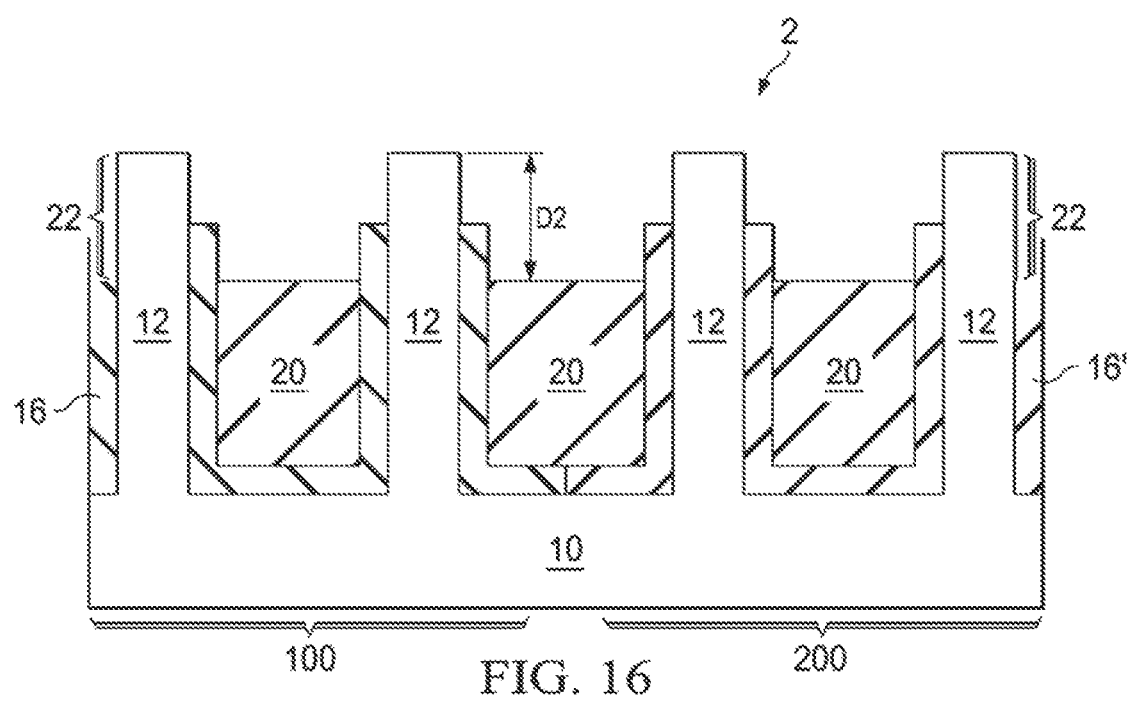
Figure 17:
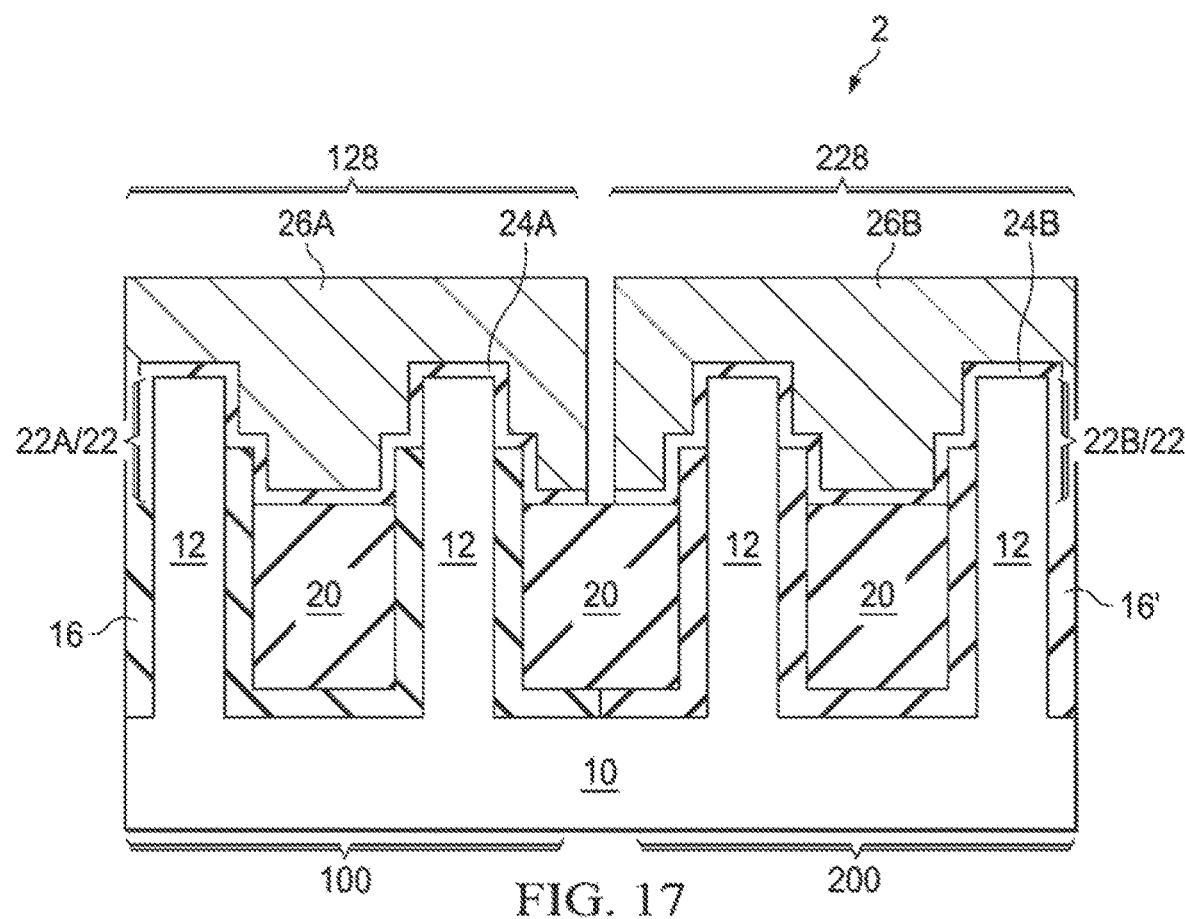

Referring to FIG. 13, photo resist 18' is formed in device region 200. Next, photo resist 18' is used as an etching mask to etch dielectric liner 16' from device region 100. As shown in FIG. 14, photo resist 18' is removed, leaving dielectric liners 16 and 16' in device regions 100 and 200, respectively. The subsequent process steps for finishing the formation of FinFETs 128 and 228 are shown in FIGS. 15 through 17. The process details of the subsequent processes may be found in the embodiments shown in FIGS. 1 through 8, and are not repeated herein.

As shown in FIG. 17, dielectric liners 16 and 16' are formed in device regions 100 and 200, respectively. Dielectric liners 16 and 16' are different from each other, and hence result in the stress applied to the fins 22A of the n-type FinFET (for example, 128) and the fins 22B of the p-type FinFET (for example, 228) to be different from each other. For example, when FinFETs 128 and 228 are n-type FinFET and p-type FinFET, respectively, dielectric liners 16 and 16' cause the stress applied to the fins 22A of n-type FinFET 128 to be more toward tensile direction than the stress applied to the fins 22B of p-type FinFET 228. In some embodiments, dielectric liner 16 applies a tensile stress to the respective fins 22A, and dielectric liner 16' applies a compressive stress to the respective fins 22B. In these embodiments, STI regions 20 may apply a tensile stress, a compressive stress, or a neutral stress to fins 22. In alternative embodiments, dielectric liner 16 has a high Young's modulus, and hence blocks the stress of STI regions from being applied on fins 22A, and dielectric liner 16' applies a compressive stress to the respective fins 22B. In these embodiments, STI regions 20 apply a compressive stress to fins 22. In yet alternative embodiments, dielectric liner 16 applies a tensile stress to the respective fins 22A, while dielectric liner 16' has a high Young's modulus, and hence blocks the stress of STI regions 20 from being applied on fins 22B. In these embodiments, STI regions 20 apply a tensile stress to fins 22.

FIGS. 18 through 26 illustrate the formation of complementary FinFETs in accordance with yet alternative embodiments. These embodiments are essentially the same as in the embodiments in FIGS. 1 through 8, except that before the formation of dielectric liner 16 and STI regions 20, lower STI regions 30 are formed to fill the bottom portions of trenches 14, leaving the top portions of trenches 14 not filled. By filling the bottom portions of trenches 14 with STI regions 30, dielectric liner 16 is formed in the trenches with a smaller aspect ratio than the trenches in the embodiments in FIGS. 1 through 8. The horizontal portions of dielectric liners are thus closer to the overlying semiconductor fins, and the stresses applied by dielectric liner 16 is increased over that in the embodiments in FIGS. 1 through 8.

Figure 18:
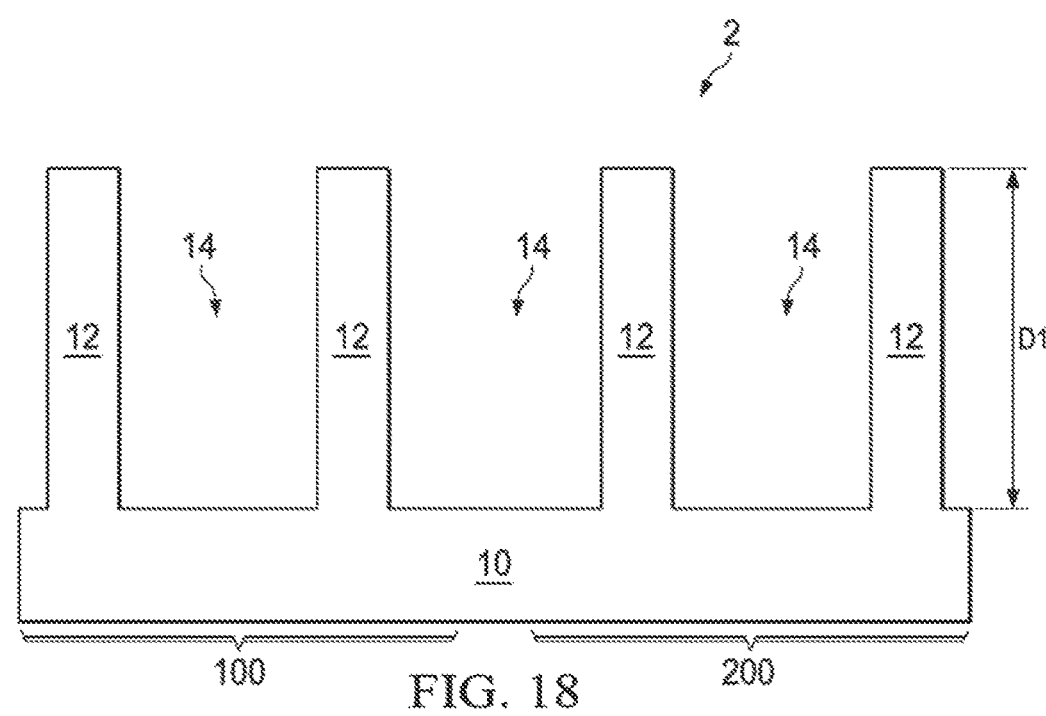
FIGS. 18 through 26 are cross-sectional views of intermediate stages in the formation of FinFETs with stressed fins in accordance with alternative embodiments, wherein lower STI regions are formed before the formation of stressed regions.
Figure 19:
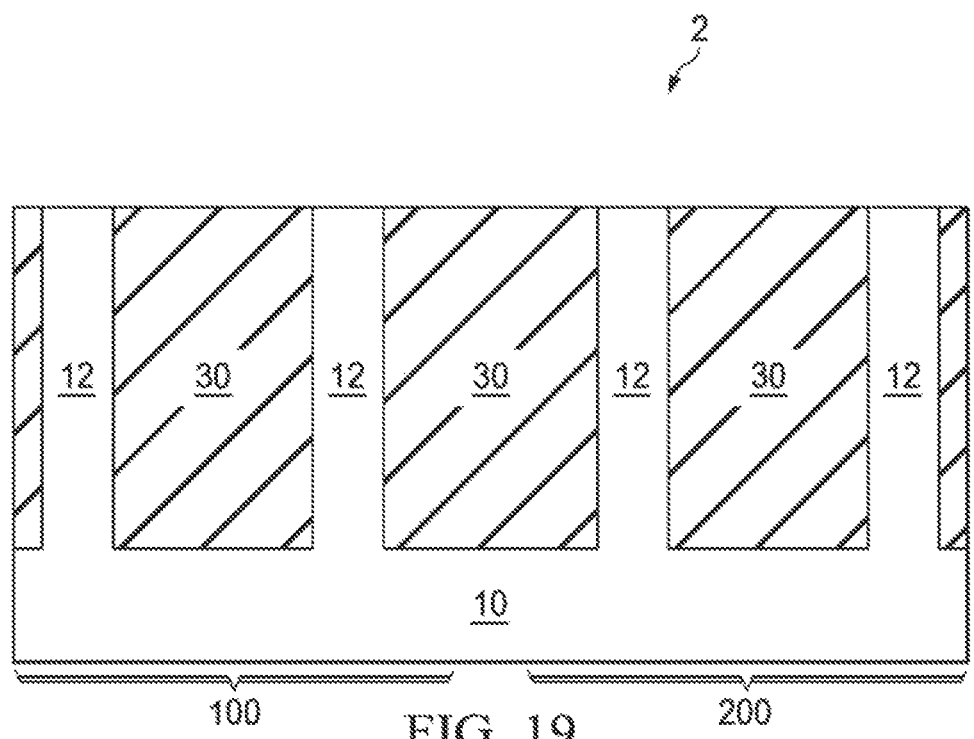

Referring to FIG. 18, substrate 10 is provided. Next, substrate 10 is etched to form trenches 14 and semiconductor strips 12. Depth D1 of trenches 14 may be in the range between about 100 nm and about 170 nm. Next, referring to FIG. 19, STI regions 30 are formed. The formation process includes the filling of a dielectric material in trenches 14 (FIG. 18), followed by a CMP. The material of STI regions 30 may be selected from the same candidate materials of STI regions 20 in FIGS. 1 through 8, and may include an oxide formed using FCVD or spin on.

Figure 20:
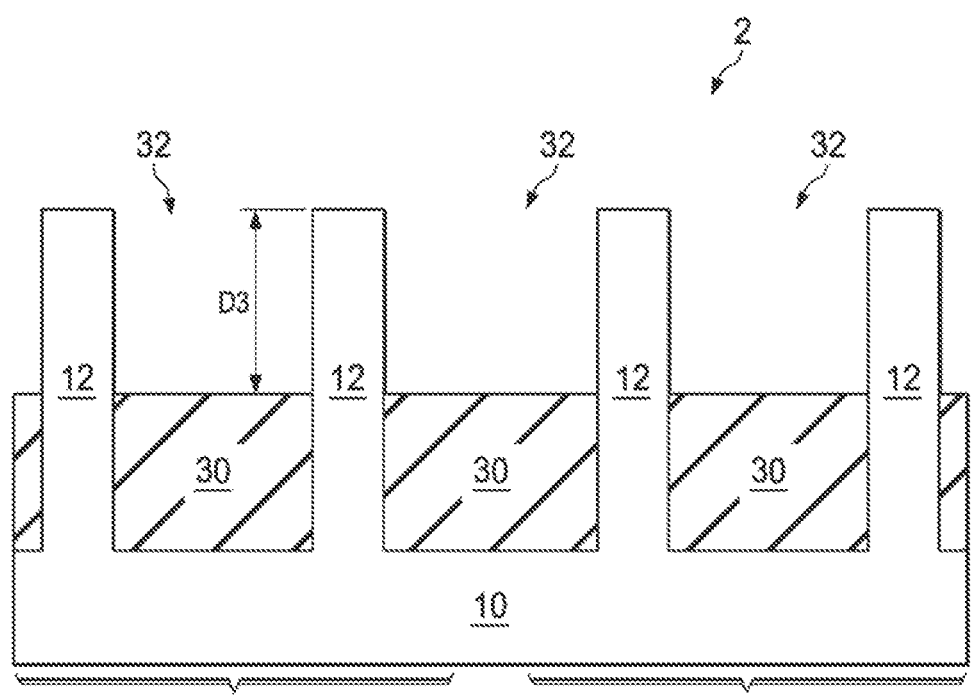
Figure 21:
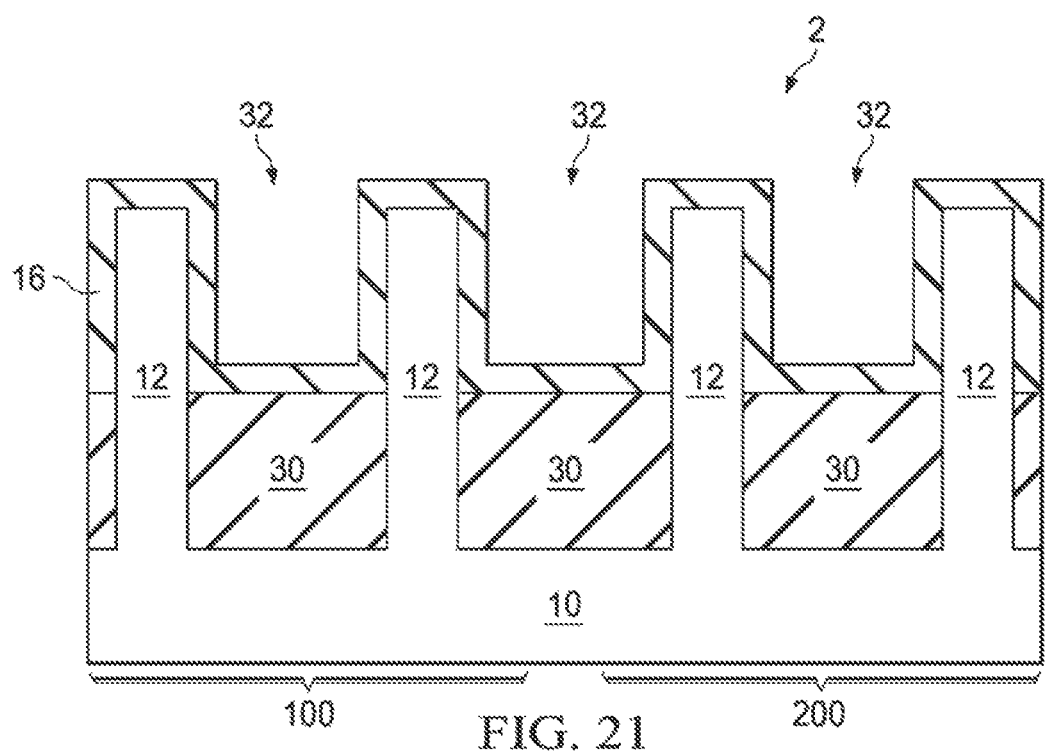

Referring to FIG. 20, STI regions 30 are recessed, with the top portions of STI regions 30 etched, to form trenches 32. The bottom portions of STI regions 30 remain after the etching. Depth D3 of trenches 32 may be in the range between about 40 nm and about 100 nm. In the subsequent step, as shown in FIG. 21, dielectric liner 16 is formed on the exposed sidewalls and the top surfaces of semiconductor strips 12. Dielectric liner 16 further extends to the bottoms of trenches 32.

Figure 22:
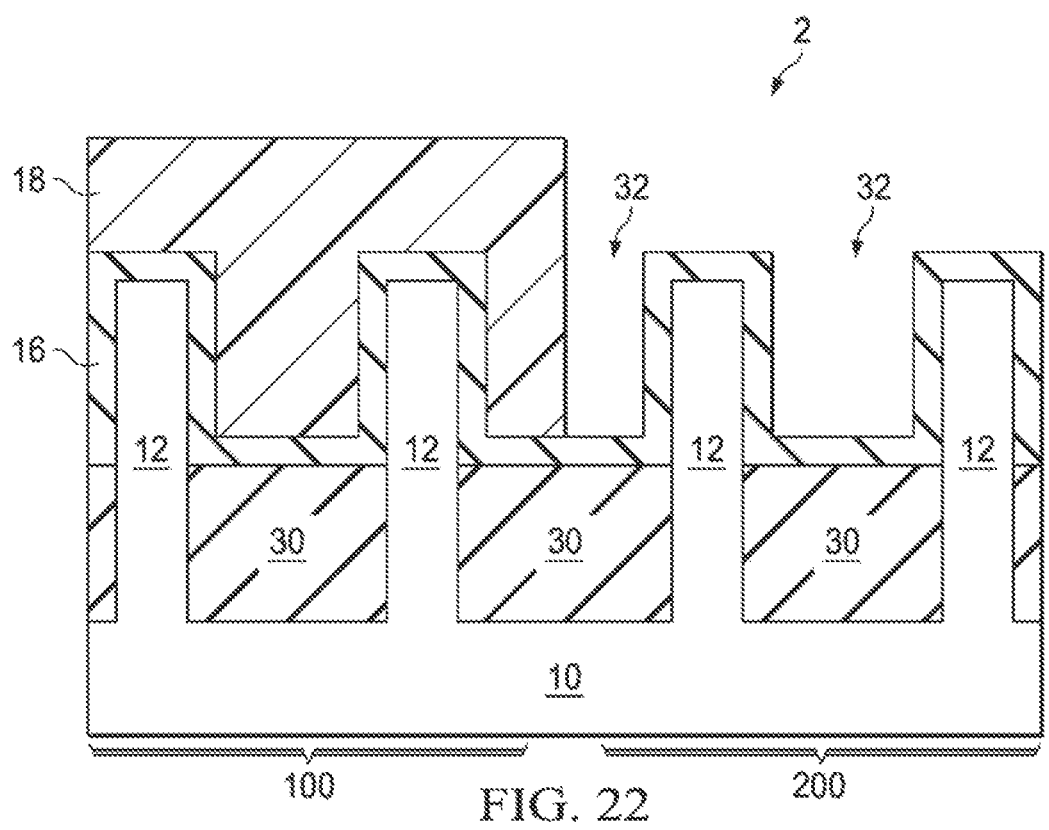
Figure 23:
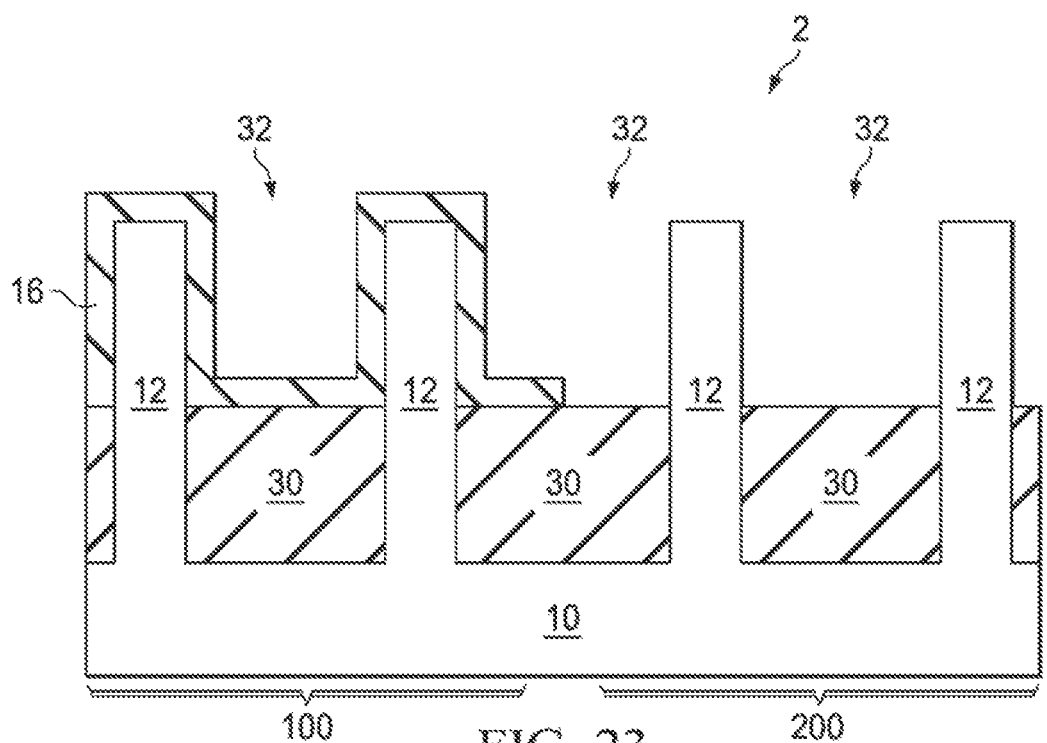
Figure 24:
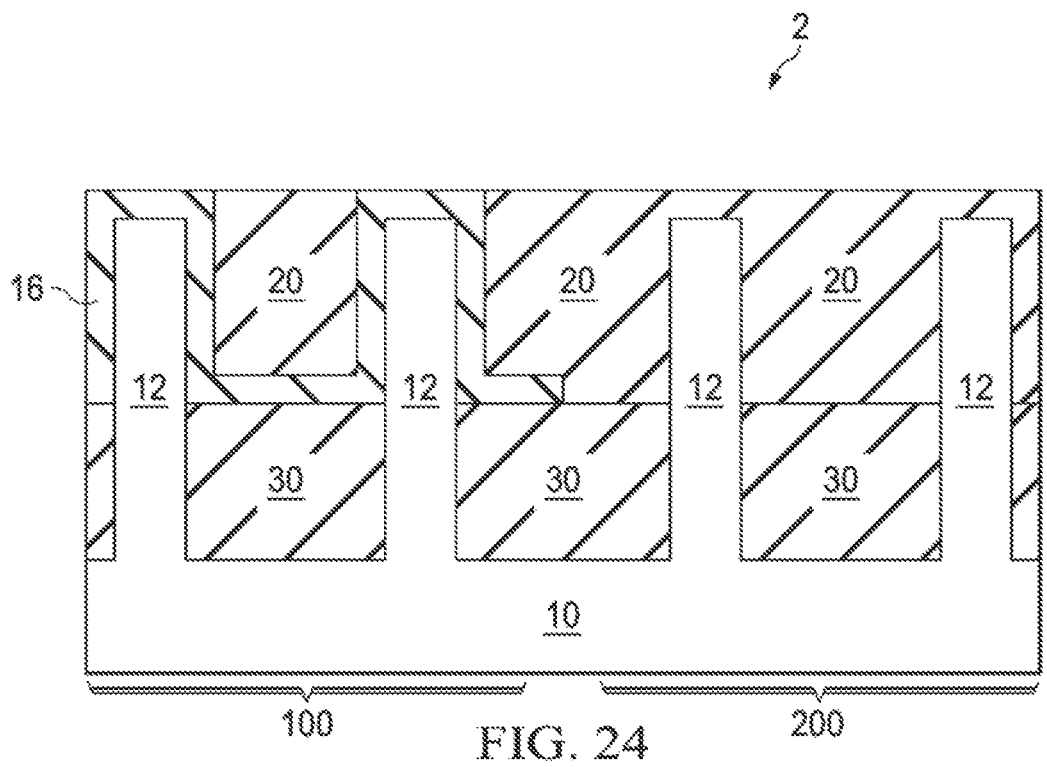
Figure 25:
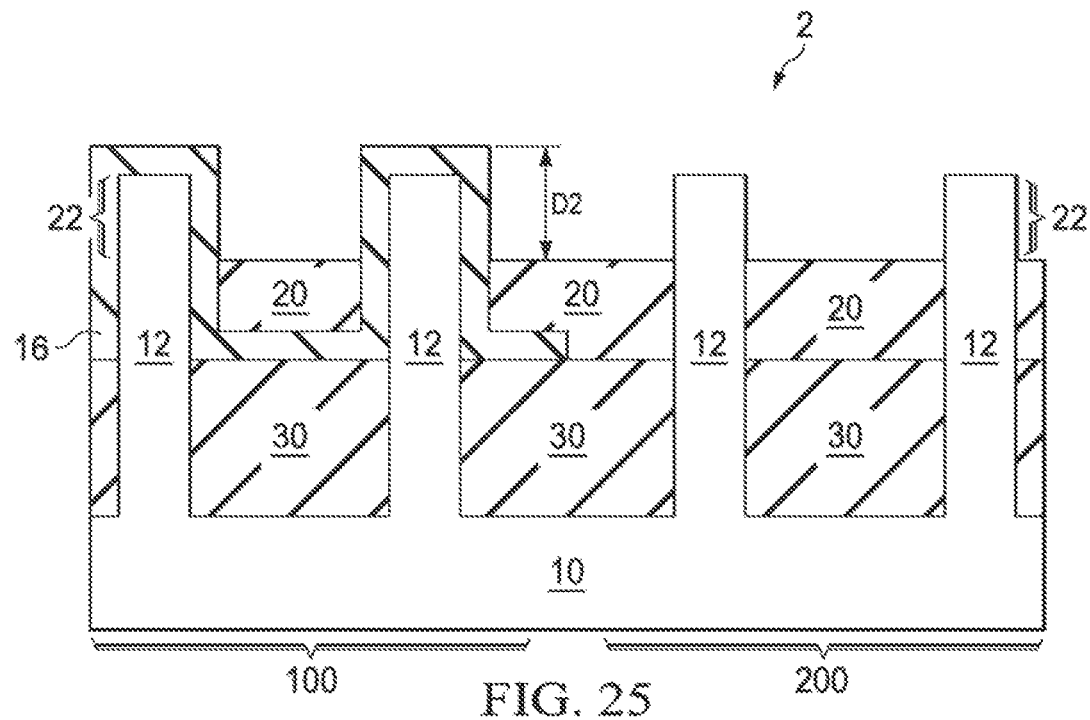
Figure 26:
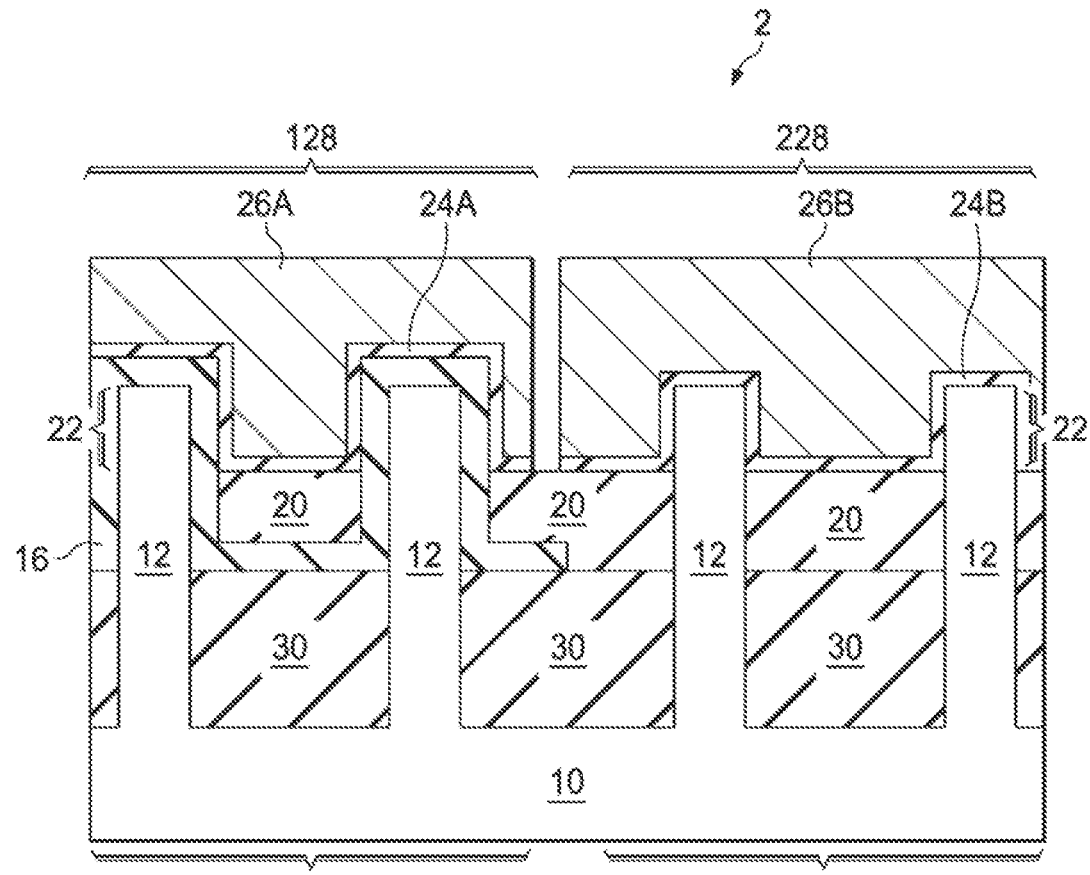

FIGS. 22 through 26 illustrate the remaining processes for the formation of FinFETs 128 and 228. The subsequent process steps and the materials are essentially the same as shown in FIGS. 4 through 8. The details of the process details and the materials of the related components may thus be found in the embodiments shown in FIGS. 4 through 8, and are not repeated herein. A brief description is provided as follows. FIGS. 22 through 23 illustrate the removal of dielectric liner 16 from device region 200. Dielectric liner 16 is left in device region 100. Next, as shown in FIG. 24, STI regions 20 are formed. FIG. 25 illustrates the recessing of STI regions 20 to form semiconductor fins 22. Gate dielectrics 24A and 24B and gate electrode 26A and 26B are then formed, as shown in FIG. 26. Source and drain regions (not shown) are then formed to finish the formation of FinFETs 128 and 228.

FIGS. 27 through 36 illustrate the formation of complementary FinFETs in accordance with yet alternative embodiments. These embodiments are similar to the embodiments in FIGS. 9 through 17, except that before the formation of dielectric liners 16 and 16' and STI regions 20, lower STI regions 30 are formed to fill the bottom portions of trenches 14, leaving the top portions of trenches 14 not filled. By filling the bottom portions of trenches 14 with STI regions 30, dielectric liners 16 and 16' (FIG. 36) are formed in the trenches with a smaller aspect ratio than the trenches in the embodiments in FIGS. 9 through 17. The horizontal portions of dielectric liners 16 and 16' are thus closer to the overlying semiconductor fins, and the stresses applied by dielectric liners 16 and 16' is increased over that in the embodiments in FIGS. 9 through 17.

Figure 27:
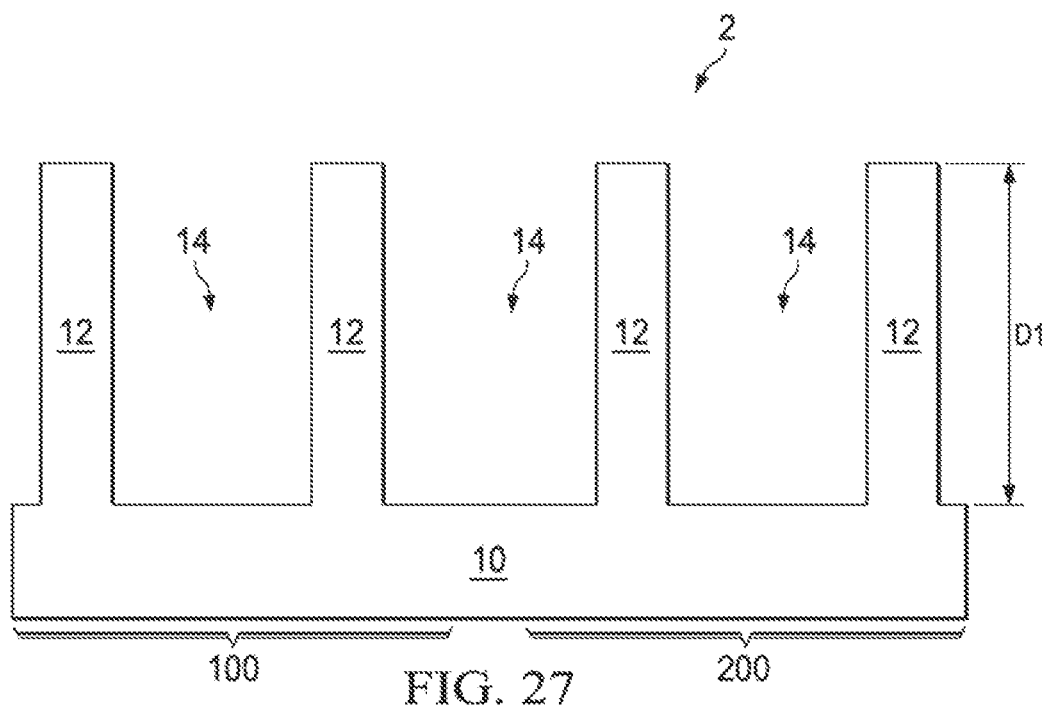
FIGS. 27 through 36 are cross-sectional views of intermediate stages in the formation of FinFETs with stressed fins in accordance with alternative embodiments, wherein lower STI regions are formed before the formation of stressed regions.
Figure 28:
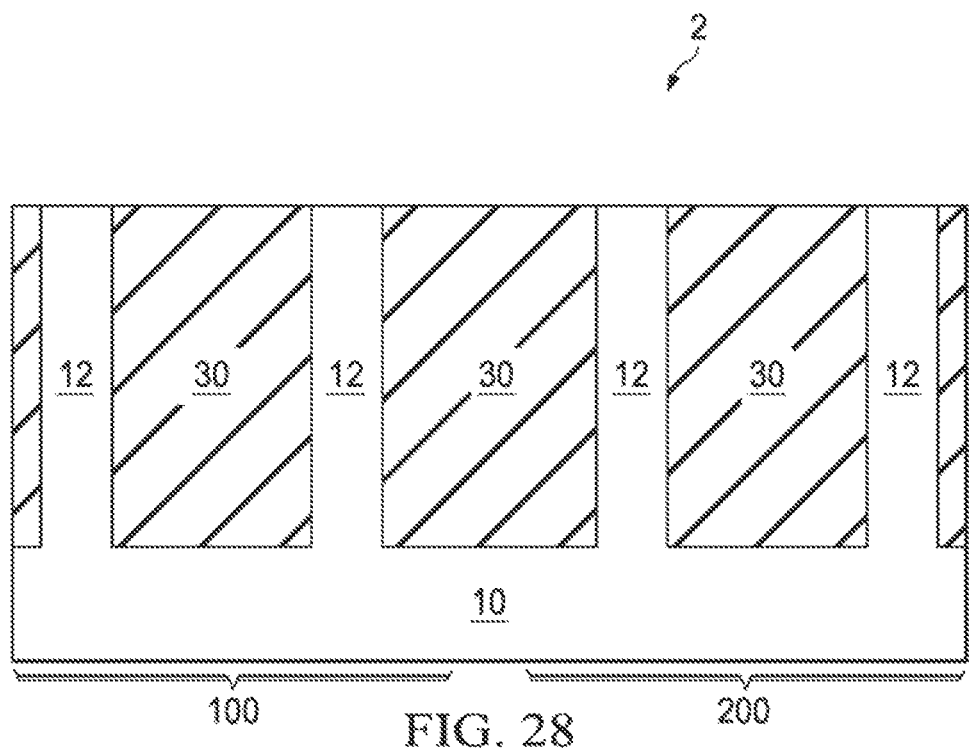

Referring to FIG. 27, substrate 10 is provided. Next, substrate 10 is etched to form trenches 14 and semiconductor strips 12. Depth D1 of trenches 14 may be in the range between about 100 nm and about 170 nm. Next, referring to FIG. 28, STI regions 30 are formed. The formation process includes the filling of a dielectric material in trenches 14 (FIG. 18), followed by a CMP. The material of STI regions 30 may be selected from the same candidate materials of STI regions 20 in FIGS. 1 through 8, and may include an oxide formed using FCVD or spin on.

Figure 29:
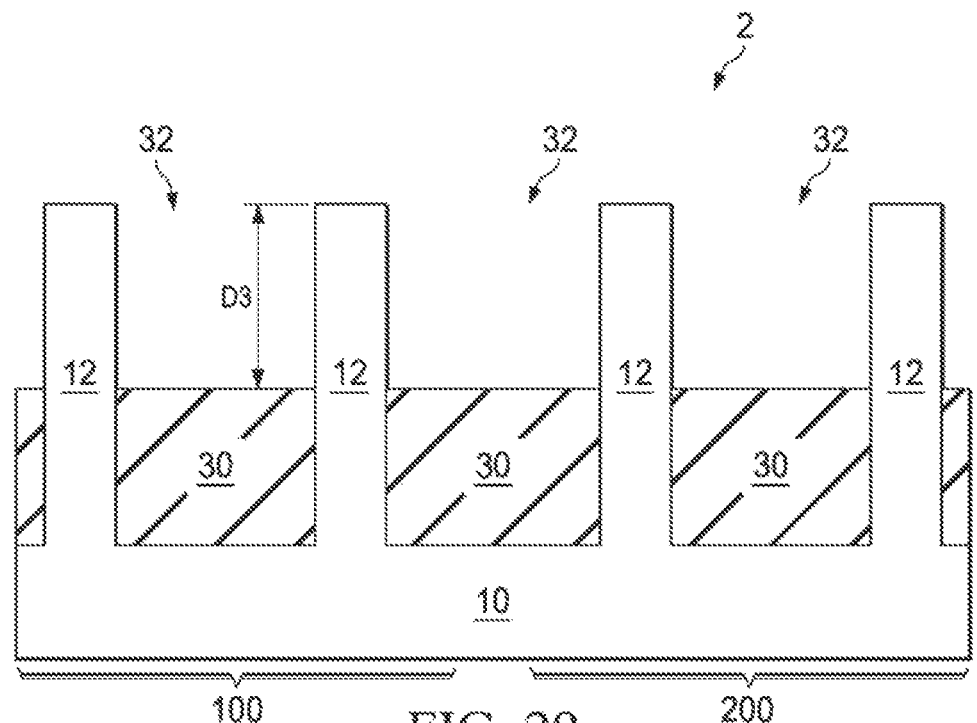
Figure 30:
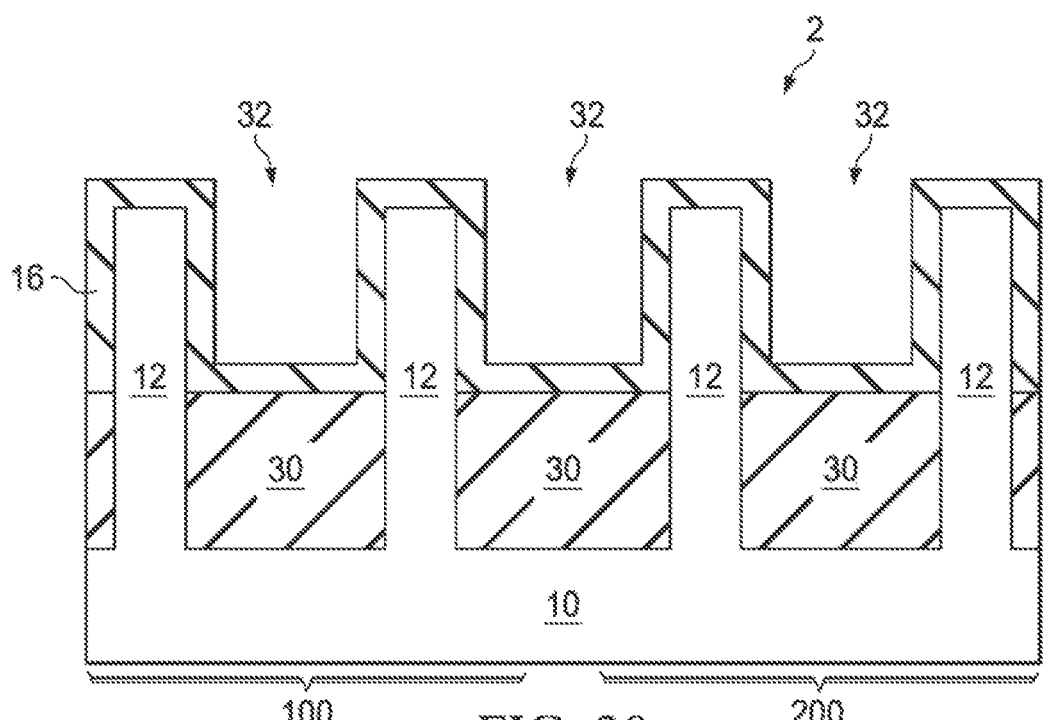

Referring to FIG. 29, STI regions 30 are recessed, with the top portions of STI regions 30 etched, to form trenches 32. The bottom portions of STI regions 30 remain after the etching. Depth D3 of trenches 32 may be in the range between about 40 nm and about 100 nm. In the subsequent step, as shown in FIG. 30, dielectric liner 16 is formed on the exposed sidewalls and the top surfaces of semiconductor strips 12. Dielectric liner 16 further extends to the bottoms of trenches 32.

Figure 31:
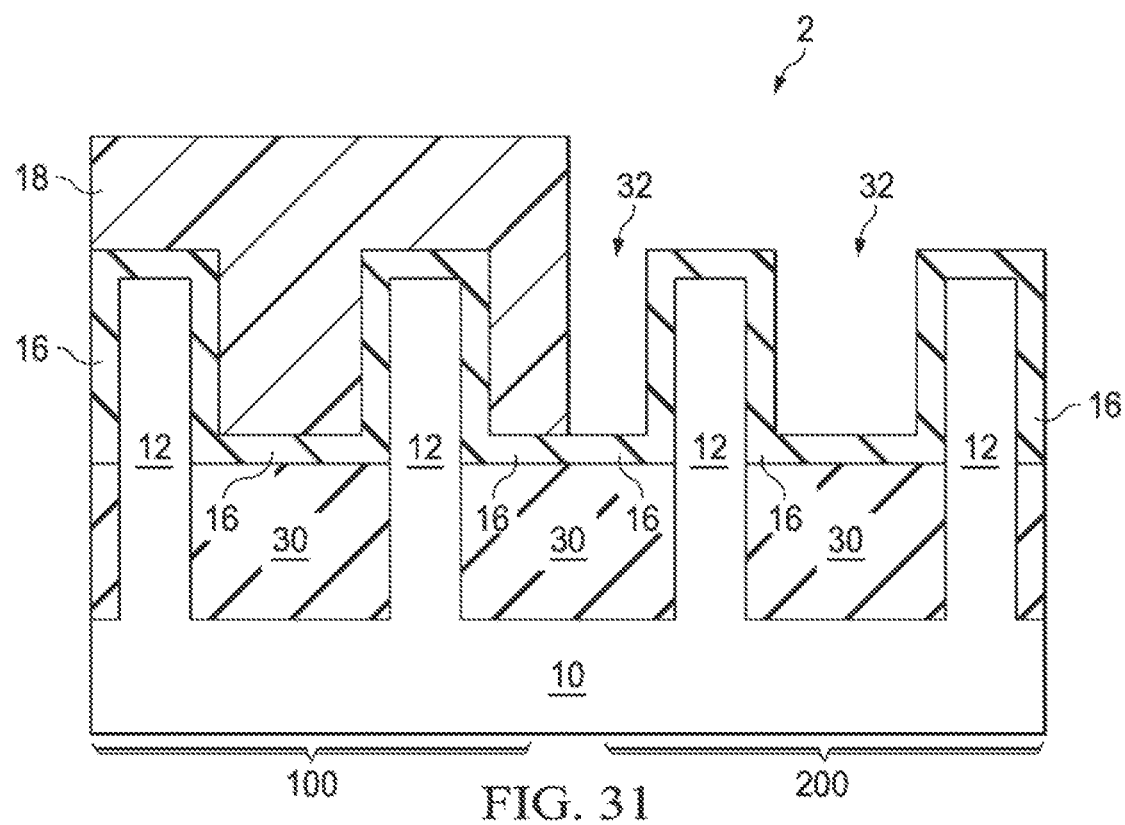
Figure 32:
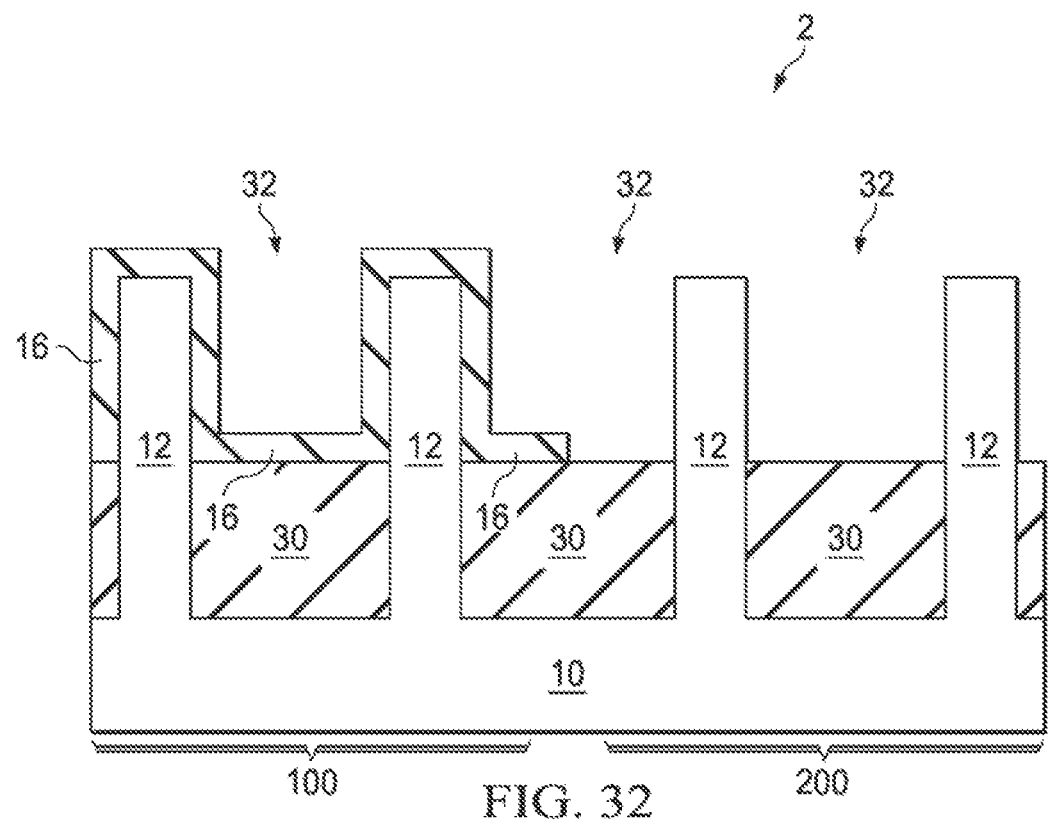
Figure 33:
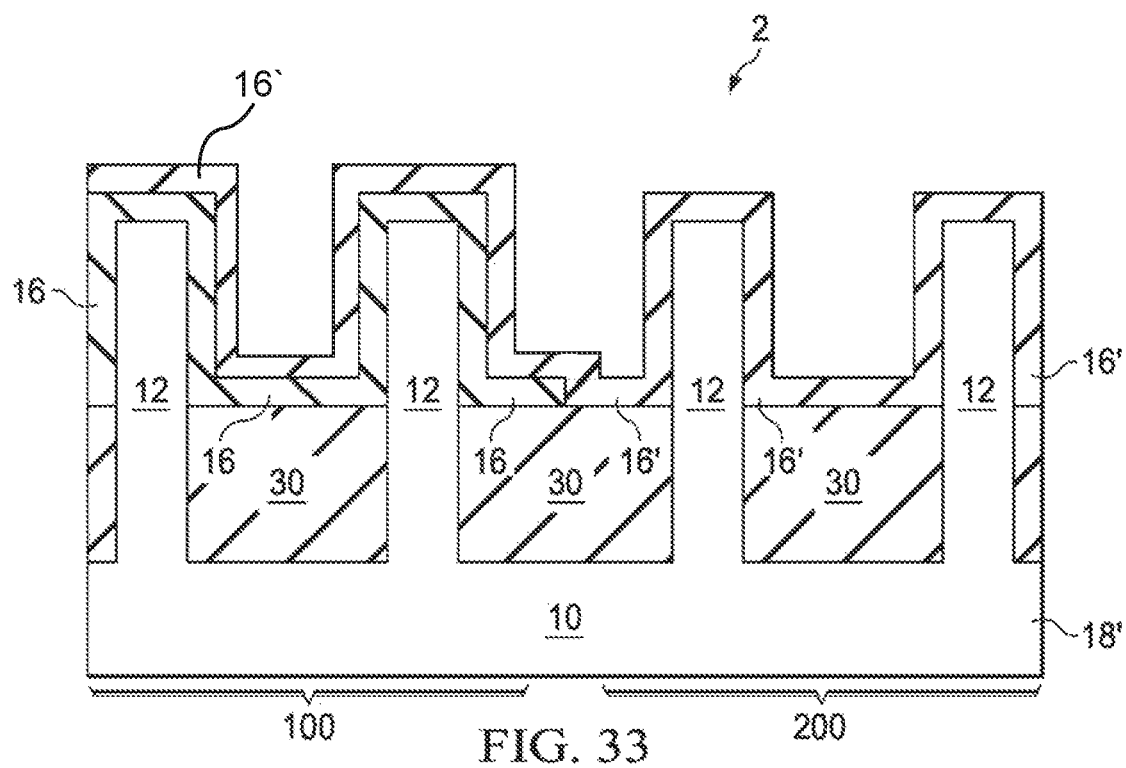
Figure 34:
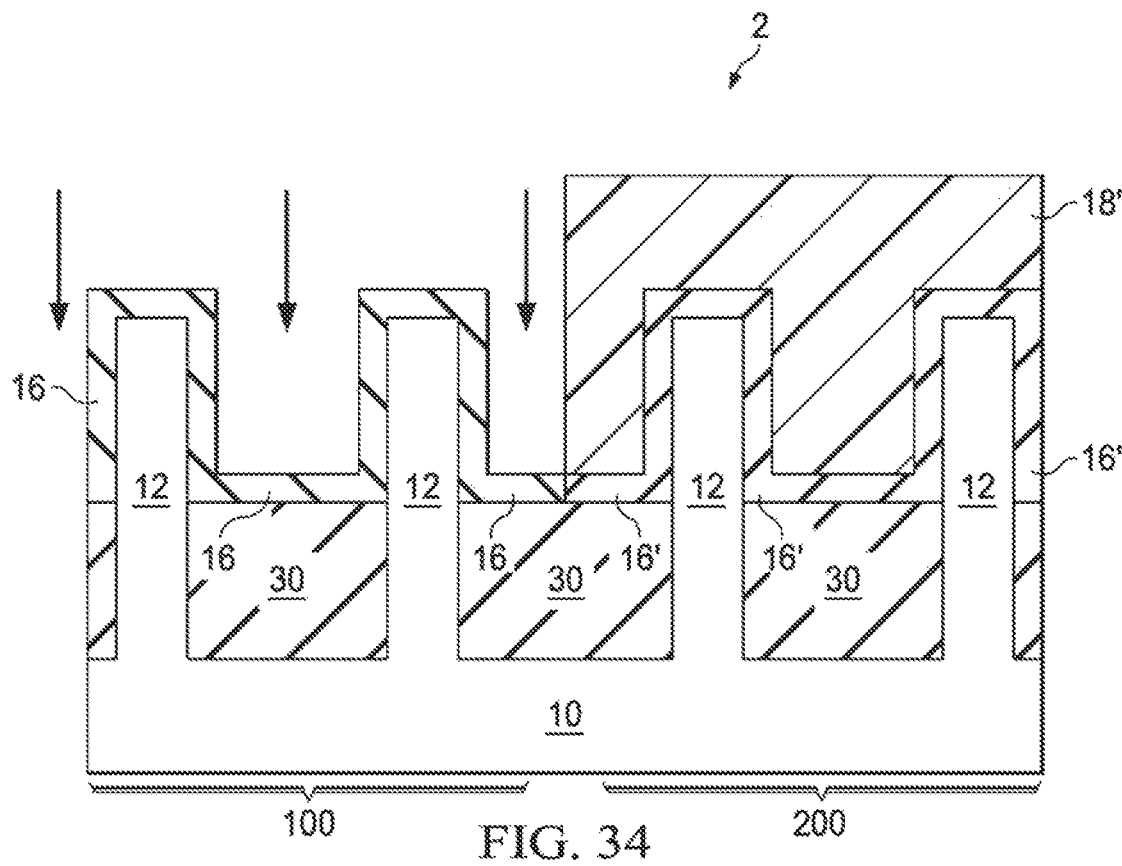
Figure 35:
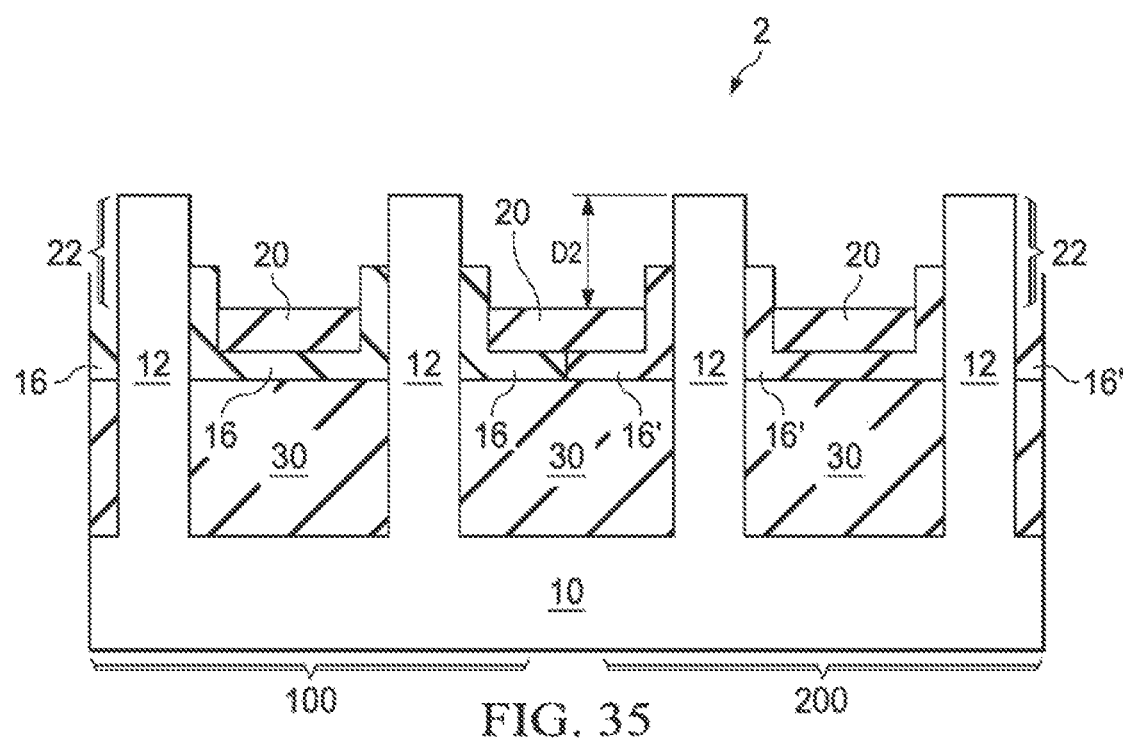
Figure 36:
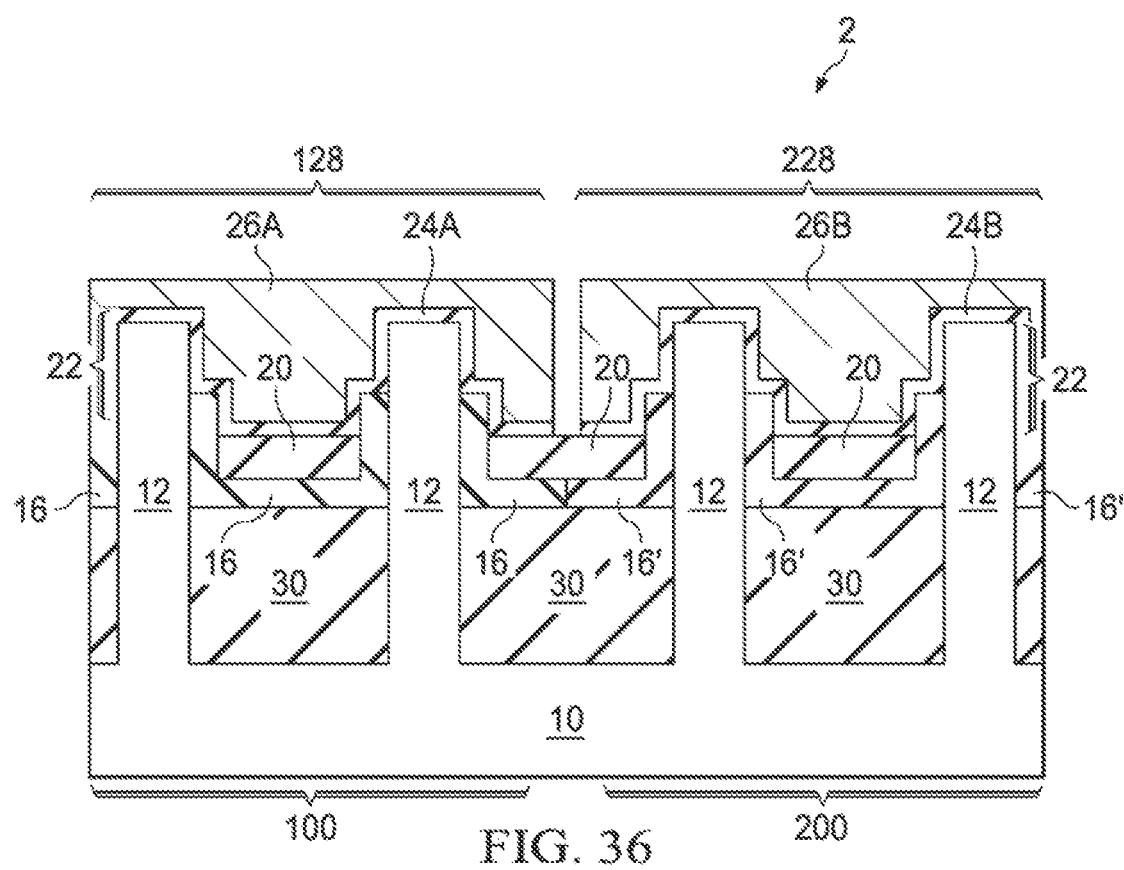

FIGS. 31 through 36 illustrate the remaining processes for the formation of FinFETs 128 and 228. The subsequent process steps and the materials are essentially the same as shown in FIGS. 10 through 17. The details of the process details and the materials of the related components may thus be found in the embodiments shown in FIGS. 10 through 17, and are not repeated herein. A brief description is provided as follows. FIGS. 31 and 32 illustrate the removal of dielectric liner 16 from device region 200. Dielectric liner 16 is left in device region 100. Next, as shown in FIGS. 33 and 34, dielectric liner 16' is formed in devices regions 100 and 200 (FIG. 33), and is then removed from device region 100 (FIG. 34). Next, as shown in FIG. 35, STI regions 20 are formed. FIG. 35 also illustrate the recessing of STI regions 20 to form semiconductor fins 22. Gate dielectrics 24A and 24B and gate electrode 26A and 26B are then formed, as shown in FIG. 36. Source and drain regions (not shown) are then formed to finish the formation of FinFETs 128 and 228.

The embodiments of the present disclosure have some advantageous features. By applying/blocking stresses through dielectric liners, which have different schemes in p-type and n-type FinFET regions, desirable stresses may be applied on the p-type and n-type FinFETs to improve the performance of the FinFETs.

In accordance with some embodiments, an integrated circuit device includes a substrate having a first portion in a first device region and a second portion in a second device region. A first semiconductor strip is in the first device region. A dielectric liner has an edge contacting a sidewall of the first semiconductor strip, wherein the dielectric liner is configured to apply a compressive stress or a tensile stress to the first semiconductor strip. An STI region is over the dielectric liner, wherein a sidewall and a bottom surface of the STI region is in contact with a sidewall and a top surface of the dielectric liner.

In accordance with other embodiments, an integrated circuit device includes a substrate having a first portion in a first device region and a second portion in a second device region, a first semiconductor strip in the first device region, and a first dielectric liner including an edge contacting a sidewall of the first semiconductor strip, wherein the first dielectric liner is configured to apply a stress to the first semiconductor strip. The integrated circuit device further includes a first STI region over the first dielectric liner, wherein a sidewall and a bottom surface of the first STI region is in contact with a sidewall and a top surface of the first dielectric liner. The integrated circuit device further includes a second semiconductor strip in the second device region, and a second STI region over the second dielectric liner. The first STI region and the second STI region are formed of a same homogenous material, wherein a sidewall and a bottom surface of the second STI region is in contact with a sidewall and a top surface of the second dielectric liner.

In accordance with yet other embodiments, a method includes etching a semiconductor substrate to form a first trench in a first device region and a second trench in a second device region, wherein portions of the semiconductor substrate form a first semiconductor strip with a sidewall exposed to the first trench, and a second semiconductor strip with a sidewall exposed to the second trench. The method further includes forming a first dielectric liner on the sidewall of the first semiconductor strip and the sidewall of the second semiconductor strip, removing the first dielectric liner from the second device region, wherein the first dielectric liner is left in the first device region, and forming a first STI region over the first dielectric liner and in the first trench, wherein a sidewall and a bottom surface of the first STI region is in contact with a sidewall and a top surface of the first dielectric liner. The method further includes forming a second STI region in the second trench, wherein the first STI region and the second STI region are formed simultaneously.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   etching a semiconductor substrate to form a first semiconductor strip and a second semiconductor strip;
   forming a first isolation region in a trench between the first semiconductor strip and the second semiconductor strip;
   depositing a first dielectric liner over the first semiconductor strip, the second semiconductor strip, and the first isolation region;
   removing a portion of the first dielectric liner from over the second semiconductor strip and a first portion of the first isolation region;
   depositing a second dielectric liner over remaining portions of the first dielectric liner, the first portion of the first isolation region and the second semiconductor strip; and
   removing a portion of the second dielectric liner from over the first dielectric liner.

2. The method of claim 1, further comprising:
   forming a second isolation region over the first isolation region, wherein a first sidewall of the second isolation region is in physical contact with a first sidewall of the first dielectric liner and a second sidewall of the second isolation region is in physical contact with a first sidewall of the second dielectric liner.

3. The method of claim 2, further comprising:
   after depositing the first dielectric liner, performing a first heat treatment; and
   after forming the second isolation region, performing a second heat treatment, wherein a difference in treatment temperatures between the second heat treatment and the first heat treatment is 100° C. or higher.

4. The method of claim 2, wherein a second sidewall of the first dielectric liner physically contacts a second sidewall of the second dielectric liner.

5. The method of claim 2, wherein the first isolation region and the second isolation region comprise different materials.

6. The method of claim 1, wherein the first dielectric liner and the second dielectric liner comprise different materials.

7. The method of claim 1, wherein at least one of the first dielectric liner or the second dielectric liner comprises aluminum oxide.

8. The method of claim 1, wherein at least one of the first dielectric liner or the second dielectric liner comprises a material that has a Young's modulus higher than 100 GPa.

9. The method of claim 1, wherein the first dielectric liner applies a first stress to the first semiconductor strip, and the second dielectric liner applies a second stress different from the first stress to the second semiconductor strip.

10. A method comprising:
    forming a first trench and a second trench in a semiconductor substrate, wherein a first sidewall of a first semiconductor strip is exposed by the first trench, and a first sidewall of a second semiconductor strip is exposed by the second trench;
    depositing a first dielectric material into the first trench and the second trench to form a first isolation region and a second isolation region, respectively;
    depositing a first dielectric liner over the first isolation region, the second isolation region, the first semiconductor strip, and the second semiconductor strip;
    removing a portion of the first dielectric liner from over the second isolation region and over the second semiconductor strip; and
    forming a second dielectric liner over the second isolation region and the second semiconductor strip, wherein the first dielectric liner applies a first stress to the first semiconductor strip, and the second dielectric liner applies a second stress different from the first stress to the second semiconductor strip.

11. The method of claim 10, wherein forming the second dielectric liner comprises:

depositing a second dielectric material over the second isolation region, the second semiconductor strip, and remaining portions of the first dielectric liner; and removing a portion of the second dielectric material from over the remaining portions of the first dielectric liner.

12. The method of claim 10, further comprising:

depositing a third dielectric material into the first trench and the second trench to form a third isolation region and a fourth isolation region, respectively, wherein the first dielectric liner is between the first isolation region and the third isolation region, and the second dielectric liner is between the second isolation region and the fourth isolation region.

13. The method of claim 12, wherein a width of the third isolation region is smaller than a width of the first isolation region and a width of the fourth isolation region is smaller than a width of the second isolation region.

14. The method of claim 12, further comprising:

etching portions of the first dielectric liner from a top surface and sidewalls of the first semiconductor strip;

etching portions of the second dielectric liner from a top surface and sidewalls of the second semiconductor strip; and recessing the third isolation region and the fourth isolation region.

15. The method of claim 14, wherein after etching portions of the first dielectric liner and the second dielectric liner, and after recessing the third isolation region and the fourth isolation region, top surfaces of the first dielectric liner and the second dielectric liner are higher than top surfaces of the third isolation region and the fourth isolation region.

16. A method comprising:

depositing a first dielectric material in a first trench and a second trench to form a first isolation region and a second isolation region, respectively, wherein the first isolation region physically contacts a first sidewall of a first semiconductor strip and the second isolation region physically contacts a first sidewall of a second semiconductor strip;

forming a first dielectric liner, wherein the first dielectric liner extends into the first trench and over a top surface and sidewalls of the first semiconductor strip;

forming a second dielectric liner, wherein the second dielectric liner extends into the second trench and over a top surface and sidewalls of the second semiconductor strip;

performing a first heat treatment;

depositing a second dielectric material in the first trench and the second trench to form a third isolation region and a fourth isolation region, respectively; and performing a second heat treatment, wherein a difference in treatment temperatures between the second heat treatment and the first heat treatment is 100° C. or higher.

17. The method of claim 16, wherein a first treatment temperature of the second heat treatment is lower than a second treatment temperature of the first heat treatment.

18. The method of claim 16, wherein the first dielectric liner extends between the first isolation region and the third isolation region, and the second dielectric liner extends between the second isolation region and the fourth isolation region.

19. The method of claim 16, wherein the first dielectric liner applies a tensile stress to the first semiconductor strip, and the second dielectric liner applies a compressive stress to the second semiconductor strip, and wherein each of the tensile stress and the compressive stress have a magnitude higher than 300 MPa.

20. The method of claim 16, wherein the first dielectric liner applies a first stress to the first semiconductor strip, the first stress having a magnitude higher than 300 MPa, and wherein the second dielectric liner has a Young's modulus higher than 100 GPa.

* * * * *